US00RE42570E

(19) United States
(12) Reissued Patent
Schuster

(10) Patent Number: US RE42,570 E
(45) Date of Reissued Patent: Jul. 26, 2011

(54) CATADIOPTRIC OBJECTIVE

(75) Inventor: Karl Heinz Schuster, Koenigsbronn (DE)

(73) Assignee: Carl Zeiss SMT GmbH, Oberkochen (DE)

(21) Appl. No.: 11/247,002

(22) Filed: Oct. 7, 2005

Related U.S. Patent Documents

Reissue of:
(64) Patent No.: 6,631,036
Issued: Oct. 7, 2003
Appl. No.: 09/741,863
Filed: Dec. 22, 2000

U.S. Applications:
(63) Continuation-in-part of application No. 09/263,788, filed on Mar. 5, 1999, now Pat. No. 6,169,627, which is a continuation-in-part of application No. 08/936,537, filed on Sep. 24, 1997, now abandoned.

(30) Foreign Application Priority Data

Sep. 26, 1996 (DE) ..... 196 39 586
Jan. 22, 2000 (DE) ..... 100 02 626

(51) Int. Cl.
*G02B 17/00* (2006.01)

(52) U.S. Cl. ..... 359/726; 359/727; 359/729; 359/731; 359/364; 359/728

(58) Field of Classification Search ..... 359/726, 359/727, 728, 729, 731, 732, 734, 737, 738, 359/364, 357
See application file for complete search history.

(56) References Cited

U.S. PATENT DOCUMENTS

| | | | | |
|---|---|---|---|---|
| 3,200,253 | A | 8/1965 | Geier | 359/555 |
| 3,244,073 | A | 4/1966 | Bouwers et al. | 359/727 |
| 3,897,133 | A * | 7/1975 | Warner et al. | 359/365 |
| 4,240,702 | A * | 12/1980 | Casas | 359/729 |
| 4,669,810 | A * | 6/1987 | Wood | 340/908 |
| 4,714,307 | A | 12/1987 | Palmer | 359/728 |
| 5,004,331 | A | 4/1991 | Haseltine et al. | 359/364 |
| 5,031,976 | A | 7/1991 | Shafer | 359/355 |
| 5,114,238 | A | 5/1992 | Sigler | 359/357 |
| 5,323,263 | A | 6/1994 | Schoenmakers | 359/364 |
| 5,359,388 | A | 10/1994 | Hollman | 355/53.54 |
| 5,488,229 | A | 1/1996 | Elliott et al. | 250/492.2 |
| 5,636,066 | A | 6/1997 | Takahashi | |
| 6,259,508 | B1 * | 7/2001 | Shigematsu | 355/53 |

FOREIGN PATENT DOCUMENTS

DE 295 16 768 3/1996

(Continued)

*Primary Examiner* — Timothy J Thompson
(74) *Attorney, Agent, or Firm* — Fish & Richardson P.C.

(57) ABSTRACT

An aspheric reduction objective has a catadioptric partial objective (L1), an intermediate image (IMI) and a refractive partial objective (L2). The catadioptric partial objective has an assembly centered to the optical axis and this assembly includes two mutually facing concave mirrors (M1, M2). The cutouts in the mirrors (B1, B2) lead to an aperture obscuration which can be held to be very small by utilizing lenses close to the mirrors and having a high negative refractive power and aspheric lens surfaces (27, 33). The position of the entry and exit pupils can be corrected with aspherical lens surfaces (12, 48, 53) in the field lens groups. The number of spherical lenses in the refractive partial objective can be reduced with aspherical lens surfaces (66, 78) arranged symmetrically to the diaphragm plane. Neighboring aspheric lens surfaces (172, 173) form additional correction possibilities.

87 Claims, 8 Drawing Sheets

FOREIGN PATENT DOCUMENTS

| | | |
|---|---|---|
| EP | 0267766 | 5/1988 |
| EP | 0396128 | 11/1990 |
| EP | 0581585 | 2/1994 |
| EP | 1059550 | 7/2000 |
| GB | 890451 | 2/1962 |
| RU | 124665 | 3/1959 |

* cited by examiner

CATADIOPTRIC OBJECTIVE

Matter enclosed in heavy brackets [ ] appears in the original patent but forms no part of this reissue specification; matter printed in italics indicates the additions made by reissue.

RELATED APPLICATIONS

This application is *a reissue of U.S. Pat. No. 6,631,036 which is* a continuation-in-part application of patent application Ser. No. 09/263,788, filed Mar. 5, 1999, which, now U.S. Pat. No. 6,169,627, in turn, is a continuation-in-part application of patent application Ser. No. 08/936,537, filed Sep. 24, 1997, now abandoned.

FIELD OF THE INVENTION

The invention relates to catadioptric objective and the use thereof in a microscope or a microlithographic projection exposure apparatus. The catadioptric objective includes spherical and aspherical lens elements and two concave mirrors which face each other. All components of the catadioptric objective, including also the object field and the image field, are arranged centered to a linear optical axis. This class of catadioptric objectives has a central aperture obscuration.

BACKGROUND OF THE INVENTION

At wavelengths in the deep ultraviolet range, that is, wavelengths less than 250 nm, mirrors having a positive refractive power are used in combination with lenses of negative refractive power as suitable means for color correction.

A catadioptric microscope objective having two concave mirrors facing each other is disclosed in Russian patent publication 124,665. The 60× magnification of the catadioptric microscope objective is achieved without intermediate imaging. Because of the low field size, only a few spherical lenses are needed for correction. A composite lens is used in addition to the mirrors for color correction. This correction means is, however, no longer available in the deep ultraviolet wavelength range.

Catadioptric objectives for microlithography having only one concave mirror are known from U.S. Pat. No. 5,691,802 or European patent publication 0,475,020. In these systems, the optical axis must be bent at least once. If reticle and wafer are to be mounted parallel to each other, then a two-fold beam deflection is required. This leads to significant complexity with respect to construction. If, in addition, a purely reflective beam splitter is used, such as disclosed in U.S. Pat. No. 5,691,802, then only off-axis object fields can be imaged. The lenses of the objective near to the field are non-symmetrically illuminated whereby asymmetrical thermal deformations and therefore imaging errors which are difficult to correct occur because of the absorption of the lenses. A centered arrangement of the optical components on a linear optical axis having two concave mirrors facing each other as shown in FIGS. 1 and 2 does not have this disadvantage. In contrast, an aperture obscuration occurs because of the cutouts in the mirrors.

The effects of an aperture obscuration on the contrast transmission function is investigated in the article of S. T. Yang et al entitled "Effect of Central Obscuration on Image Formation in Projection Lithography" (SPIE Volume 1264, Optical/Laser Microlithography III (1990), pages 477 to 485. For incoherent illumination, the contrast is reduced for low spatial frequencies in comparison to an unvignetted system. The acceptance of obscured objectives can therefore be significantly increased when the aperture obscuration is further reduced. In addition, a reduction of the contrast transmission function must not necessarily lead to a reduction of the resolution capacity because of the nonlinear response function of the photoresist. By suitably selecting the photoresist, the break in the contrast transfer function continues to lie above the exposure threshold of the photoresist.

SUMMARY OF THE INVENTION

It is an object of the invention to further reduce the aperture obscuration and the lens diameters in objectives of the kind described above. It is a further object of the invention to provide excellent imaging and color correction for the field sizes typical for microlithography and an increase of the image end aperture compared to the state of the art with the least possible use of material.

The catadioptric objective of the invention transmits a light beam along a light path and defines an optical axis. The catadioptric objective includes in sequence of the travel of the light beam: a first lens group having a negative refractive power and arranged centered on the optical axis; a first concave mirror having a central cutout and being arranged centered on the optical axis downstream of the first lens group; a second concave mirror having a central cutout and being arranged centered on the optical axis downstream of the first concave mirror; the first and second concave mirrors being disposed so as to face each other; a second lens group having a negative refractive power and being arranged centered on the optical axis downstream of the second concave mirror; the first lens group having a first plurality of lenses arranged upstream of the first concave mirror; the second lens group having a second plurality of lenses arranged downstream of the second concave mirror; and, one of the first and second plurality of lenses having at least one aspheric lens surface.

The catadioptric objective of the invention is normally combined as a partial objective with at least one dioptric (purely refractive) partial objective to form a reduction objective. The combination of a catadioptric component objective with at least one dioptric partial objective and the use in a microscope or in a microlithographic projection exposure apparatus is also described.

In the catadioptric objective, the light rays starting from the object plane first pass through a first lens group having a negative refraction power and then impinge on a first concave mirror which has a hole at its center. This concave mirror is mounted concavely to the object plane. The light is reflected back and impinges on the second concave mirror which likewise has a central hole. This second concave mirror is mounted concavely to the image plane. In this way, the two concave mirrors face each other. The light rays are reflected back from this second concave mirror and pass through a second lens group having a negative refractive power before they impinge on the image plane of this catadioptric partial objective.

The cutouts in the mirrors make a continuous ray trace possible but lead to a central obscuration in the illumination of the diaphragm plane. All rays which would impinge in the region of the mirror cutouts when reflected at the concave mirrors do not contribute to imaging and have to be vignetted via suitable measures. An obscuration of the aperture rays occurs. The rays which proceed from an object point are characterized as aperture rays and these rays lie within a bundle of rays delimited by the system diaphragm.

The first lens group, the two concave mirrors and the second lens group are arranged centered on a common optical axis defining a straight line. The aperture obscuration and the use of material for the lenses is further reduced because of the targeted use of aspheric surfaces.

By using with one or several partial objectives, the intermediate image, which is generated by this catadioptric objective, shows intense aberrations which are then compensated with the additional objectives in the total image. The catadioptric objective is to exhibit a chromatic overcorrection and/or overcorrection of the Petzval sum as a compensation for combination with dioptric partial objectives.

It is especially advantageous when the lens elements directly forward of the first concave mirror and/or the lens elements directly after the second concave mirror have an intense negative refractive power. The lens elements can be individual negative lenses or can be several lens elements which, however, have to exhibit an overall negative refractive power. It is advantageous when these lenses having negative refractive power or adjacent lenses have aspheric lens surfaces. These lenses with negative refractive power generate a chromatic overcorrection. The amount of the chromatic axial aberration for lenses having a refractive power $\Phi$ and a marginal ray height $h_{RD}$ is proportional to $h_{RD}^2 \cdot \Phi$ and the lenses having negative refractive power close to the mirror have a low marginal ray height because of the required low aperture obscuration. For this reason, the refractive power of the lenses has to be that much higher in order to achieve an adequate chromatic overcorrection.

It is advantageous when the lenses of the object end field lens group and/or the image end field lens group have at least one aspheric surface in order to influence the chief ray angle in the object plane and the image plane. All those lenses are counted to the field lens group within which the marginal ray of an object point of the optical axis runs between the optical axis and the chief ray of the outermost field point.

A further feature of the invention is that the first lens group can be subdivided into three subgroups. The center subgroup has a positive refractive power; whereas, the first and third subgroups have negative refractive powers. For the correction, it advantageous when a lens of the center subgroup has an aspherical surface.

To hold the lens diameter small, the lenses of the first and second lens group advantageously are passed through only in one direction. Lenses, which are run through a multiple number of times, should be in the light path between the concave mirrors and have correspondingly large diameters. However, this does not preclude that the first and/or second lens group extend partially into the space between the mirrors.

If the absolute value of the magnification ratio of this catadioptric objective lies approximately between 0.70 and 1.30, then an assembly symmetrical to the diaphragm plane can be achieved for the concave mirrors and their central cutouts. In this way, the diameters of the cutouts and therefore their contributions to the aperture obscuration are similarly large. If the magnification ratio does not lie in this region, then the first and second lens group have different focal lengths and it is significantly more difficult to maintain the diameters of the cutouts the same size. A further advantage of an absolute value of the magnification ratio between 0.7 and 1.3 and of a configuration symmetrical to the diaphragm plane is the fact that asymmetrical imaging errors such as coma can be well controlled in a low order.

The minimum aperture obscuration is achieved when the last lens of the first lens group and the first lens of the second lens group are each arranged in the region of a mirror cutout. It is therefore advantageous when individual lenses or at least lens parts are located in the geometric space between the first and second concave mirrors.

A concave surface which comes close to a hemisphere is advantageously provided in the first and/or second lens group. The ratio of half a lens diameter to the radius of the surface is greater than 0.70 for these surfaces. The concave surface of the first lens group then faces toward the object plane and the concave surface of the second lens group faces toward the image plane. The aperture obscuration can be held very low because of these very intense diverging surfaces close to the concave mirrors.

It is advantageous that the lens having the concave surface or an adjacent lens has an aspherical lens surface. The aperture obscuration can be further reduced with the aspherical surface in the proximity of a lens having a high negative refractive power.

The maximum deflection of the marginal ray within the first lens group and/or within the second lens group can be achieved with low aperture obscuration when a lens surface is provided in close proximity to the concave mirrors so that the angles of incidence of the marginal rays referred to the surface normal assume maximum values at the particular passthrough point. The angles of incidence are limited upwardly only by the necessity of an antireflecting coating, which is adapted for the particular working wavelength, and unwanted polarization effects for angles of incidence close to the Brewster angle. In this way, the sines of the angles of incidence for these lens surfaces result which, in any event, are greater than the object end numerical aperture by a factor of three.

It is advantageous when the lens has a surface, which has high angles of incidence, or an adjacent lens has an aspherical surface. In this way, aberrations can be compensated which are caused by the surface having high angles of incidence.

It is possible to reduce the aperture obscuration to values below 35% and even down to 20% with the aspheric surfaces and the lenses having high negative refractive power in the proximity of the concave mirrors. The aperture obscuration is defined as a percent ratio of the sine of the ray angle of a ray which proceeds from an object point on the optical axis and is targeted to the edge of the mirror hole and the sine of the ray angle of the marginal ray of the same object point. The ray angles are determined with respect to the optical axis.

If the concave mirrors are arranged forward and rearward of the diaphragm plane, then the holes of the mirrors are almost symmetrical to the diaphragm plane. With this measure, the field-dependent aperture obscuration can be minimized. With the diaphragm plane between the concave mirrors, the chief rays intersect the optical axis after the reflection at the first concave mirror and forward of the reflection at the second concave mirror.

The catadioptric objective is so configured that a ray trace, which is substantially symmetrical to the diaphragm plane, results between the first and second lens groups so that the ray height of the marginal ray, which proceeds from an object point on the optical axis, at the last surface of the first lens group differs from the ray height of the same marginal ray at the first surface of the second lens group by a maximum of 20%.

A large aperture expansion is required in order to hold the aperture obscuration as low as possible and to reduce the structural length of the objective. If one looks at a ray, which intersects the optical axis in the object plane, then the aperture expansion can be defined as the ratio of the sine of the angle $i_2$ of this ray after the first lens group to a sine of the angle $i_1$ of the same ray forward of the first lens group. The angles are then each determined with respect to the optical axis. With a negative refractive power of the first lens group, the aperture expansion $$m = \left|\frac{\sin(i_2)}{\sin(i_1)}\right|$$

is adjusted to greater than 2.0.

With aspheric surfaces, it is possible to control the aperture expansion in dependence upon the angle of the ray impinging upon the first lens group. With very high values for the aperture expansion and lenses having high negative refractive power, a significantly higher aperture expansion results for purely spherical lens surfaces for the marginal rays than, for example, for a paraxial ray. The increase of the aperture expansion with increasing ray angle leads to larger mirror diameters and therefore to an increase of the objective dimensions. With aspherical lens surfaces forward and rearward of the concave mirrors, the aperture expansion can be influenced in dependence upon angle. The object is that the ratio $m_R/m_P$ is less than 1.1 and preferably less than 1.05 for the aperture expansion $m_R$ for a marginal ray and for the aperture expansion $m_P$ for a paraxial ray. The aspherical surfaces forward and rearward of the concave mirrors are so configured that the effect, which is generated by the aspherical surface of the first lens group, is compensated to a large extent by the aspherical surface of the second lens group. The action of the aspherical surfaces cannot be viewed completely in isolation but only in combination with the neighboring system surfaces.

The lens diameters can be greatly reduced in comparison to the mirror diameters with the intense aperture expansion of the first lens group and the corresponding aperture reduction of the second lens group. Material which is transparent in the low ultraviolet range and has large diameters is very expensive and is only available to a limited extent. For this reason, it is advantageous when the maximum lens diameters amount to only 20% to 25% of the mirror diameters.

For coupling the catadioptric objective to the illuminating system, it is advantageous when the catadioptric objective has an almost homocentric entrance pupil. The deviation of the object end pupil function from a line fit through this pupil function can serve as an index. The object end pupil function is understood to mean the trace of the tangent values of the chief ray angles in the object plane over the intersect heights of the chief rays in the object plane. An objective having a homocentric entry pupil would exhibit a linear pupil function. The compensating line is determined from all ray-angle ray-height value pairs in the region from $-Y_{max}$ to $+Y_{max}$ wherein $Y_{max}$ is the maximum possible object height of the circular-shaped object field. The deviation of the pupil function from the line fit should and can be maximally ±10 mrad, preferably maximally ±5 mrad.

It is possible that all lenses are of the same material because of the color correction with the aid of both concave mirrors and the mirror-near lenses having high negative refractive power.

With wavelengths ≦250 nm, preferably the fluoride crystals $CaF_2$, $BaF_2$, $SrF_2$, LiF, NaF, KF can, inter alia, be used in addition to special quartz glasses and mixed crystals.

In the intermediate spaces between the lenses, a gas is advantageously provided which exhibits only a slight absorption in the region of the working wavelength. The gas charge can be provided with synthetic air, $N_2$ or rare gases in dependence upon working wavelength. Large light paths occur in the space between the concave mirrors and disturbances because of refractive index fluctuations and pressure fluctuations have a great influence. For this reason, the space between the concave mirrors is preferably filled with a gas whose refractive index exhibits a lower temperature dependency and pressure dependency than nitrogen. Helium is ideally suited.

It is purposeful to couple the described catadioptric objective with a refractive objective in a reduction objective. The catadioptric objective of the invention defines a first partial objective which images the object plane into an intermediate image plane. The intermediate image plane is imaged to demagnified with a refractive second objective on the image plane. The magnification ratio of the reduction objective typically lies in the range from −0.1 to −0.5. The sequence of catadioptric and refractive component partial objectives can also be reversed. In the catadioptric partial objective, the chromatic axial aberration and the image field curvature are so overcorrected by the lenses, which are adjacent to the concave mirrors having intense negative refractive powers so that a corrected image results in the image plane of the reduction objective with reference to chromatic aberration and image field curvature. The lenses of the refractive partial objective correct the image errors spherical aberration, oblique spherical aberration and coma for an image field greater than 20 mm and an image end aperture greater than NA=0.7.

The intermediate image by the catadioptric partial objective is only inadequately corrected. Aberrations such as a large inner coma are present in the intermediate image because of the intense aperture expansion and the lenses having high negative refractive power. To correct these aberrations, which are introduced by the catadioptric partial objective, and to provide adequate correction of the large image field and the high numerical aperture, it is advantageous when the refractive partial objective has at least one aspherical surface.

Two aspherical lens surfaces are arranged symmetrically to the diaphragm plane and permit a correction of the spherical aberration as well as the correction of the field-dependent aperture aberration such as coma and oblique spherical aberration. The two aspherical lens surfaces are arranged in such a manner that a chief ray has at both surfaces a similarly large ray height with respect to magnitude and the difference in the ray heights amounts to maximally 30% and preferably less than 20%.

In these and other objectives, it is advantageous to provide two mutually adjacent aspherical surfaces to correct the spherical aberration and the sine condition. The two aspherical surfaces can define the two sides of a lens or they can be provided on two lenses and lie separated from each other by an air space. These double aspheres close to the diaphragm plane are especially effective so that the ray heights of the chief ray of the outermost field point at the adjacent aspherical surfaces are maximally 15%, preferably maximally 10% of the diameter of the diaphragm.

If the refractive partial objective is disposed forward of the image plane of the entire objective, then it is advantageous to provide an aspheric surface in the field lens group next to the intermediate image plane in order to influence the chief ray angles in such a manner that a telecentric trace of the chief rays results at the image end. The chief ray angles with reference to the image plane should lie within the entire image field in the range of ±5 mrad. The object end field lens group of the refractive partial objective includes all the lenses within which the marginal ray of an object point of the optical axis runs between the optical axis and the chief ray of the outermost field point.

Because of the chromatic overcorrection of the catadioptric partial objective, it is possible to utilize only lenses made of one material in the refractive partial objective even for a bandwidth of the light source of several pikometers (up to 10 pm).

The reduction objective is formed from the catadioptric partial objective and the refractive partial objective and can be used also in a microscope because of the high numerical aperture of NA>0.70. In the reduction objective, the object plane and the image plane are to be exchanged, that is, the objective is to be operated in the opposite direction. A further increase of the aperture can be achieved with a reduction of the field size.

The objective can be used for the inspection of wafers with small fields, very high apertures and wavelengths less than 250 mm. This can take place in the context of a narrow wavelength band or a broad wavelength band.

Usually, this class of catadioptric reduction objectives is used in microlithography. The objective is then a component of the microlithographic projection exposure system. The following lasers can be used as light sources in the DUV/VUV wavelength range: ArF laser for 193 nm, $F_2$ laser for 157 nm, $Ar_2$ laser for 126 nm and NeF laser for 109 nm. An illuminating system ensures the homogeneous illumination of the structure mask. The field lens group of the illuminating system functions to adapt the exit pupil of the illuminating system to the entrance pupil of the projection objective. The illuminating system additionally includes means for controlling the partial coherence and for field masking the structural mask.

Microstructural components having structural sizes even below 0.1 μm can be produced with a microlithographic projection exposure system of the above kind.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
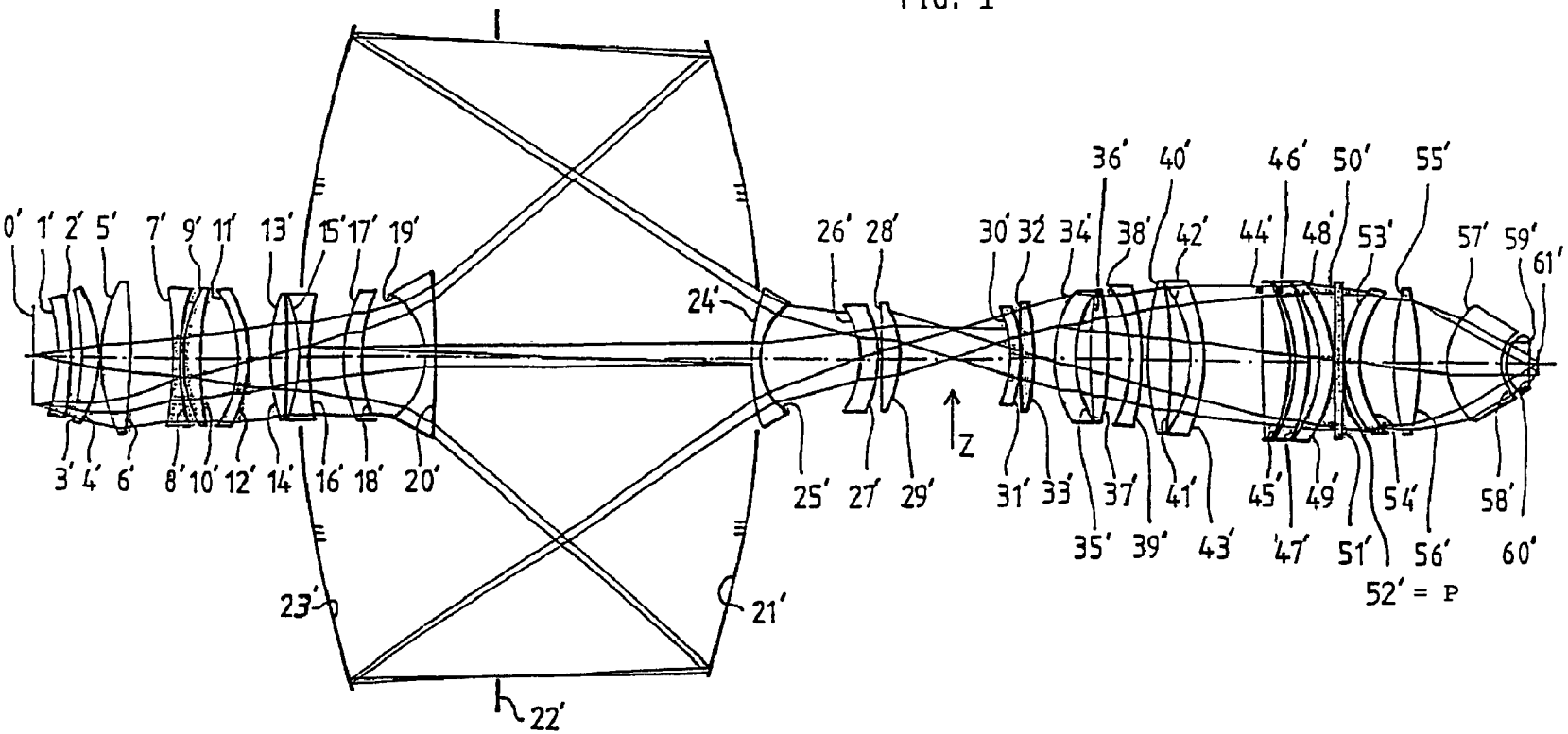
FIG. 1 is a side elevation section view taken through the lenses of a catadioptric microlithographic reduction objective.

The lens section view shown in FIG. 1 together with the data in Table 1 describe a catadioptric microlithographic reduction objective. Here, a total of 27 lenses and two mirrors (21',23') as well as a planar plate (50'/51') are shown arranged between object (O) and image plane 61'. For an image field diameter of 27 mm, the diameter of the largest lens (19'/20') is approximately 173 mm and the diameter of the largest mirror 23' is approximately 707 mm. As shown in FIG. 1, other lenses such as lens (17'/18') have a diameter less than lens (19'/20'). The central bore amounts to approximately 35% of the mirror diameter. The objective is configured for the wavelength 193.38 nm and the image end numerical aperture is 0.70.

An intermediate image plane Z is realized between the surfaces 29' and 30' and meniscus lenses (46', 47'; 48', 49') and (53', 54') are provided at the additional pupil P corresponding thereto. These meniscus lenses optimally correct image errors generated by the mirrors (21', 23') and especially off-axis image errors.

A planar plate (50'/51') is provided between the meniscus lenses directly in the region of the pupil P. During manufacture of these objectives, this planar plate (50'/51') can be used for the purpose of correcting residual errors of the objectives via small form corrections which can, for example, be generated by ion ray etching thus making a nonspherical, nonplanar surface but retaining the overall planar shape.

The object-end lens group (1' to 20') is a wide angle retrofocus objective. The lens group (24' to 29') is mirrored with respect to function to the lens group (1' to 20') and is forward of the intermediate image Z of this type. The meniscus lenses (19', 20' and 24', 25') cause the light beam to diverge greatly at the mirror end and thereby result in the small central bore. The two lens groups (1' to 20') and (24' to 29') extend into the mirror arrangement (21', 23'). It is an important function of the meniscus lenses (19', 20') and (24', 25') to create a large axial chromatic aberration. This aberration is compensated by all of the remaining lenses.

The greatly convex surface 57' in combination with the glass thickness of the corresponding lens up to the surface 60' is significant for the here-described objective class and is similarly conventional for microscope objectives.

All lenses are spherical and are made of quartz glass. Other materials (calcium fluoride) can be provided for the operation at lower wavelengths such as 157 nm.

The mirrors are aspherical in accordance with the known power series expansion:

$$P(h)=(1/2R)h^2+c_1h^4+\ldots+c_nh^{2n+2}$$

wherein: P is the sagitta as a function of the radius h (elevation to the optical axis) with the aspheric constants $c_1$ to $c_n$ presented in Table 1. R is the vertex radius from Table 1. The deviations of the mirror surfaces from the spherical are moderate and can be controlled during manufacture. The type of glass listed in Table 1 is SUPRA1 or quartz.

The manufacture of such aspherical mirrors in the diameter range of 0.5 to 1 meter is known from the area of astronomic instruments. For assembly-line manufacture, shaping techniques such as galvano forming can be applied. The manufacturing accuracy does not have to be too great because conjugated corrective surfaces are available on the above-mentioned planar plate (50'/51') or on one of the adjacent meniscus lens surfaces 48', 49', 53' or 54'.

An optical element (50', 51') is arranged in the region of the pupil (P) following the intermediate image (Z). This optical element (50', 51') has non-spherical corrective surfaces.

It is also possible to provide elastic mirrors. As a departure from the known alignment cementing, these mirrors can be adjusted in an assembly phase utilizing actuators and can then be fixed on a rigid carrier. On the other hand, these mirrors can be controlled in optimal form during operation on line with, for example, piezoelectric actuators in order to compensate, for example, for thermal lens effects.

Figure 2:
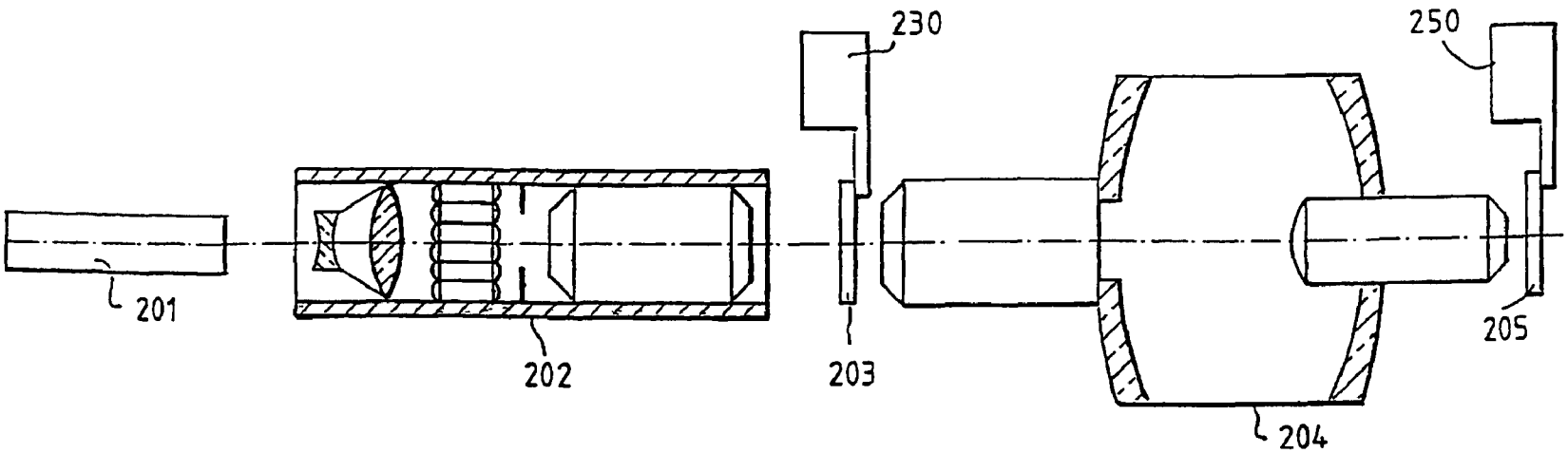
FIG. 2 is a side elevation view, in section, of a projection exposure system.

A projection exposure system is shown in FIG. 2 and includes a light source 201, for example, an excimer laser emitting light at a wavelength below 250 nm. An illumination system 202 is arranged downstream of the light source 201. Reference numeral 230 identifies the mask holder and operating system. The mask holder holds a mask 203 on the optical axis downstream of the illumination system 202 as shown. A catadioptric reduction objective 204 follows the mask holder and operating system 230 and can, for example, correspond to the catadioptric microlithographic reduction objective shown in FIG. 1. The reduction objective 204 has a reduction ratio in the range of 1:2 to 1:10.

The object is identified by reference numeral 205 and can be, for example, a semiconductor wafer or LCD panel. The object 205 is held by an object holder and operating system 250.

The catadioptric reduction objective shown in FIGS. 1 and 2 includes a catadioptric first partial objective having two mutually facing concave mirrors, an intermediate image plane and a refractive second partial objective. With the aspherical concave mirrors and the spherical lenses, the central shading is reduced to only about 35% of the mirror diameter for an aperture of NA=0.70 and an image diameter of 27.00 mm so that the contrast transmitting function is already significantly affected.

To correct residual errors, non-spherical corrective surfaces are provided in the vicinity of the diaphragm plane following the intermediate image plane. The form of the corrective surfaces is dependent upon the residual errors of the individual sample so that the aspherical corrective surfaces are not part of the objective design.

At wavelengths less than 200 nm, normal quartz glass is not suitable; however, fluoride crystals (for example, $CaF_2$) can be used but these materials are available only to a limited extent in the required quality and size. For this reason, it is desirable to provide a design wherein the lens diameters are still further reduced so that a lesser amount of expensive fluoride material need be used.

Finally, it is better for the size of the aperture obscuration to omit the lenses of the first lens group located between the two concave mirrors.

Figure 3:
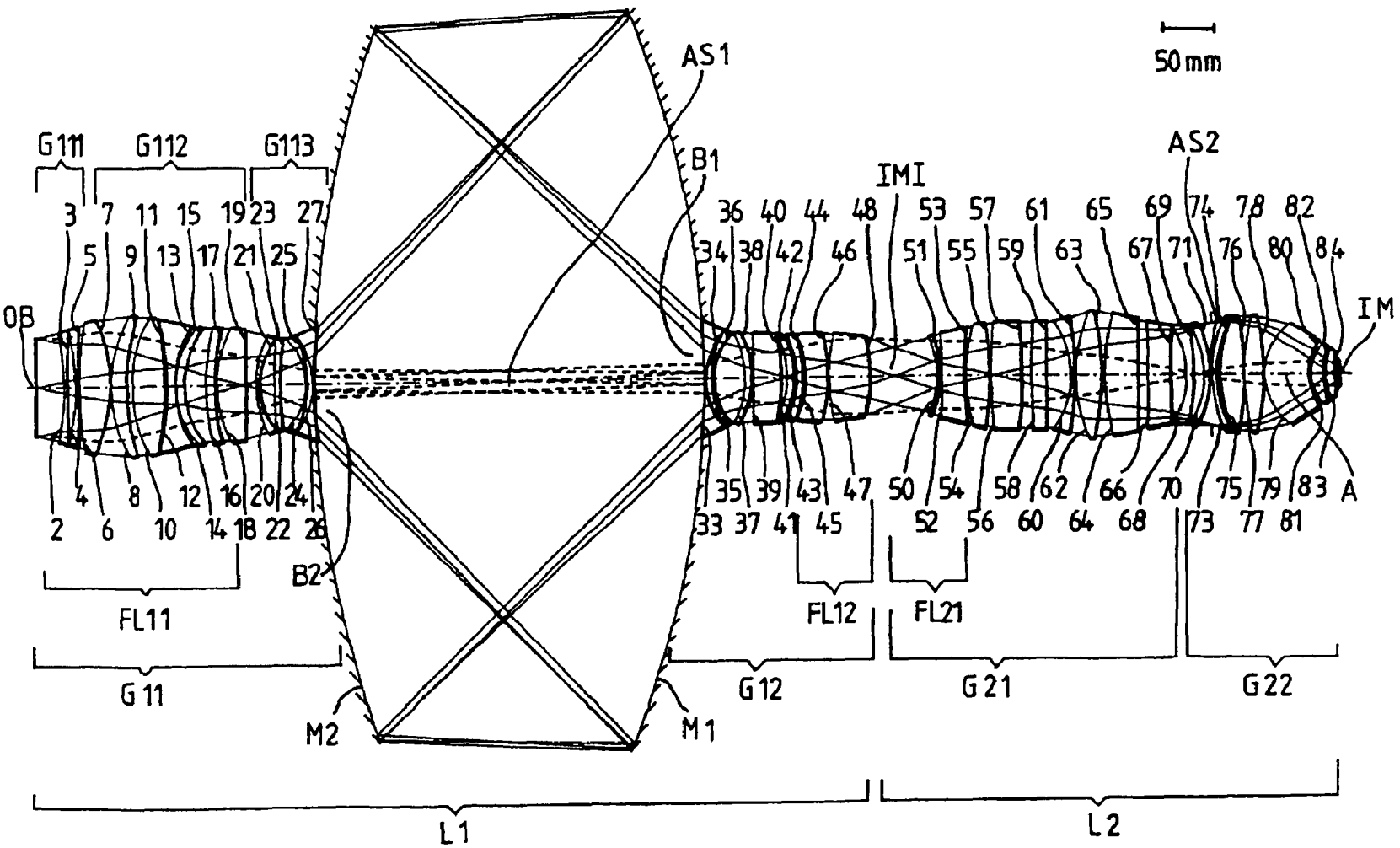
FIG. 3 is a section view taken through the lenses of a catadioptric reduction objective according to an embodiment of the invention.

FIG. 3 shows an embodiment for the catadioptric reduction objective of the invention having aspheric lenses and wherein the lens diameters are reduced compared to the embodiments of FIGS. 1 and 2 and operation is at wavelengths less than 200 nm. The optical data for the objective of FIG. 3 are presented in Table 2.

The catadioptric reduction objective includes a catadioptric first partial objective L1 having surfaces 2 to 48 and a refractive second partial objective L2 having the surfaces 50 to 84. The catadioptric first partial objective L1 images the object plane OB slightly demagnified on the intermediate image plane IMI with a magnification ratio $\beta_{L1}=-0.76$. The intermediate image plane IMI is imaged by the refractive second partial objective L2 on the image plane IM significantly demagnified with a magnification ratio of $\beta_{L2}=-0.33$. In this way, the total magnification ratio $\beta$ of the object plane OB in the image plane IM is $\beta=-0.25$. The circularly-shaped object field OB has a diameter of 91.2 mm and the corresponding image field IM has a diameter of 22.8 mm. If the catadioptric reduction objective is used in lithography, then object field and image field are rectangularly shaped. For example, a rectangularly-shaped field having the X-Y dimensions 22 mm×6 mm can be placed in the circular-shaped image field as would be suitable for a wafer scanner. The image end numerical aperture is NA=0.8 in the first embodiment. A numerical aperture this high in combination with a large image field has only recently been presented for projection objectives.

All lenses of this catadioptric reduction objective are made of the same material, in this case, $CaF_2$. $CaF_2$ has a refractive index of 1.55841 at the working wavelength of $\lambda=157.3$ nm. If one has the possibility in the wavelength region less than 250 nm to use a second material having higher dispersion in lenses having negative refractive power, then the color correction can be further improved. For example, sodium fluoride NaF as a counterpart to $CaF_2$ is, for example, conceivable.

At wavelengths $\lambda<200$ nm, oxygen $O_2$ is absorbent so that a gas charge with $N_2$ or a suitable rare gas is provided. In the first embodiment, the lens intermediate spaces are filled with $N_2$.

The catadioptric partial objective L1 comprises a first lens group G11 having surfaces 2 to 27, a first concave mirror M1 having a central cutout B1, a first pupil plane AS1, a second concave mirror M2 having a central cutout B2 and a second lens group G12 having surfaces 33 to 48. These optical components are passed through by the light rays in the sequence indicated. In FIG. 3, the chief and marginal rays are shown for an object point on the optical axis (Y=0.0) and two additional object points on the field edge at $Y_{min}=-45.6$ mm and $Y_{max}=45.6$ mm. The chief rays are shown as broken lines because they are masked by the aperture obscuration in the real system and are only of a theoretical nature.

The two concave mirrors M1 and M2 facing each other fulfill two significant tasks in the catadioptric partial objective L1: the concave mirrors together with the neighboring lenses of negative refractive power generate the overcorrection of the axial chromatic aberration and the field curvature. As concave mirrors, they have a large positive refractive power but do not introduce any chromatic image errors. For chromatic overcorrection in the intermediate image plane IMI, the first lens group G11 and the second lens group G12 have a high negative refractive power whose diverging action is again compensated by the concave mirrors so that the first partial objective L1 generates a real image. Simultaneously, the lenses having negative refractive power with low marginal ray heights in combination with mirrors of positive refractive power with high marginal ray heights are the ideal correction means for field flattening. With the catadioptric partial objective L1, the field curvature in the intermediate image plane IMI can be overcorrected so that a planar image field results in the image plane IM after the imaging with the refractive partial objective L2 without additional corrective means for field flattening being needed in the refractive partial objective 12.

The mirror hole B1 of the concave mirror M1 and the mirror hole B2 of the concave mirror M2 lead to an obscuration in the pupil illumination. Specific aperture regions cannot be transmitted with this class of objectives. In the first embodiment, for an object point on the optical axis, the sine of the marginal ray angle is $\sin(i_{Max})=0.2$ and the sine of the minimum possible aperture angle is $\sin(i_{Min})=0.0369$. The aperture obscuration is computed at 18.5%.

A corresponding masking device is provided in the pupil plane AS1 in order to shade the rays which would impinge on the cutout B1 of the first concave mirror M1 and have an aperture angle of less than $i_{Min}$. This masking device is so selected that the aperture obscuration is of the same size for all object points and lies centered to the chief ray. The minimally possible aperture obscuration of 18.5% for a point on the optical axis is increased to 20% when considering all object points. This masking device can, for example, be a circular absorbing disc which is arranged centered to the optical axis. A rod can serve as a holder which extends along the optical axis and is attached to the lens surfaces 27 and 33. In both lens surfaces, a recess can be machined (for example, with a diamond) in which the holding rod can be seated. The region about the optical axis in the vicinity of the pupil plane AS1 is not in the imaging beam path. For this reason, the holding device can be so designed that there is no effect on the imaging. A holder of the masking device having spokes or the like extending from the lens holder or mirror holder would lead to diffraction and thereby lead to a reduction of the resolution capacity.

The aperture obscuration affects the contrast transmission function of this class of objectives. For this reason, it is advantageous when the aperture obscuration is held as small as possible. All optical components of the catadioptric partial objective L1 are therefore so designed that the aperture obscuration remains limited to a minimum possible value.

It is necessary that the lenses next to the concave mirror have a large negative refractive power in order to hold the aperture obscuration small. In the embodiment, these are the lenses having the surface number 24/25, 26/27 and 33/34, 35/36. In the first lens group G11, the lenses contain concave surfaces 24 and 26, which are concave to the object plane OB and, in the second lens group G12, the lenses have concave surfaces 34 and 36 concave to the intermediate image plane IMI with very high values for the aperture ratio of lens height $h_{max}$ to lens radius R. Thus, for surface 24, $h_{24}^{max}/R_{24}=0.72$ and for surface 36, $h_{36}^{max}/R_{36}=0.75$. The aperture ratio of the concave surfaces for these negative lenses close to the mirrors is therefore significantly greater than 0.7.

The last lens 26/27 of the first lens group G11 is designed as a biconcave lens in order to obtain the maximum expansion of the aperture rays after the lens group G11. The angles of incidence of the aperture rays in the optically thinner medium (that is, with a refractive index less than 1.1) on the lens side 27, which faces toward the concave mirror M1, assume the largest possible values. In the present example, the sine of the incident angle with respect to the surface normal in the optically thinner medium for the marginal ray on the surface 27 for an object point on the optical axis is $\sin(i_{27}^{RD})=0.779$. Correspondingly, the first lens 33/34 of the second lens group G12 is a biconcave lens and the lens surface 33 is a surface where high angles of incidence are present. Accordingly, the sine of the angle of incidence in the optically thinner medium with respect to the surface normal for the same marginal ray is $\sin(i_{33}^{RD})=0.722$.

It is possible to greatly expand the aperture rays with the negative refractive power of the first lens group G11. Thus, the sine of the angle of the marginal ray of an object point on the optical axis is 0.200 forward of the first lens group G11 and 0.706 after the first lens group G11 with respect to the optical axis. The aperture expansion for this marginal ray therefore is 3.532. Because of the negative refractive power of the second lens group G12, the sine of the angle of the same marginal ray with respect to the optical axis reduces from 0.676 forward of the second lens group G12 to 0.304 after the second lens group G12, that is, by the factor 1/2.254.

The aperture expansion is dependent upon the magnitude of the aperture angle $i_1$ forward of the first lens group G11. With a very great ray deflection with only a few spherical lens elements, an increase of the aperture expansion with an increasing aperture angle $i_1$ would occur which, in the following, is identified as a positive distortion of the aperture expansion. This distortion is unwanted because it leads to an increase in the mirror diameters without being able to thereby reduce the aperture obscuration. In order to reduce the positive distortion of the aperture expansion with purely spherical lens surfaces, the negative refractive power of the lenses 24/26 and 26/27 would have to be distributed to additional lenses in order to reduce the angle of incidence of the diverging surfaces. Additional lenses would, however, lead to an increase of the structural length and to further transmission losses.

The distortion of the aperture expansion can be corrected without additional lens elements when an aspherical lens surface 27 is provided in the lens group having negative refractive power (surfaces 24 to 27). It is advantageous when the last lens surface 27 of the first lens group G11 is aspheric because, in this way, the dispersion of the ray angles directly forward of the first concave mirror M1 can be influenced. The object is to reduce the positive distortion of the aperture expansion and, in the ideal case, reverse into a negative distortion. With a reduction of the aperture expansion for increasing aperture angles $i_1$, the mirror diameters can be reduced with the aperture obscuration remaining the same. In the present example, the aperture expansion $m_R=3.532$ for a marginal ray having $i_1^R=0.2$. The aperture expansion $m_P=3.465$ for a paraxial ray having $i_1^P=0.002$. The paraxial ray would not exhibit a throughgoing ray trace because of the aperture obscuration in the real system; however, it is viewed here as a fictitious system without mirror cutouts. The ratio of the aperture expansion $m_R$ for the marginal ray and $m_P$ for the paraxial ray is $m_R/m_P=1.019$. The positive distortion of the aperture expansion lies only at 2% with the aspherical lens surface 27. The first surface 33 of the second lens group G12 is likewise aspherical in order to compensate the distortion of the aperture expansion introduced by the aspherical surface 27. The surfaces 27 and 33 are next to the concave mirrors and are aspheric as are the concave mirrors M1 and M2. For this reason, the aperture rays between the first and second lens groups G11 and G12 are guided in such a manner that the mirror diameters can be reduced with aperture obscuration being constant.

To minimize the aperture obscuration further, the two concave mirrors M1 and M2 and the lenses 26/27 and 33/34, which are close to the mirrors, are arranged almost symmetrically to the pupil plane AS1. The distances of the concave mirrors M1 and M2 as also of the lens surfaces 27 and 33 to the pupil plane AS1 each are 189.73 mm. The two mirrors are arranged concave to the diaphragm plane and have similar curvatures. The negative lenses 26/27 and 33/34 are biconcave lenses. The weaker curved surfaces each face the pupil plane AS1. With this assembly, a beam trace, which is substantially symmetrical to the pupil plane AS1 results between the surfaces 27 and 33. Accordingly, a marginal ray from an object point on the optical axis has approximately the same ray elevation at the last surface 27 of the first lens group G11 and at the first surface 33 of the second lens group G12. At surface 27, the beam height $h_{G11}=40.66$ mm and at surface 33, the ray height $h_{G12}=40.56$ mm. With this assembly, which is symmetric to the pupil plane AS1, the contribution of the mirror holes B1 and B2 to the aperture obscuration is almost the same.

In the first embodiment, at least the peripheral regions of the lens 26/27 and the lens 33/34 are disposed in the space between the concave mirrors M1 and M2. In this way, one achieves that, on the one hand, the spacing of the lens 26/27 to the concave mirror M1 and the spacing of the lens 33/34 to the concave mirror M2 is as small as possible. On the other hand, the beam path between the concave mirrors M1 and M2 may only be minimally vignetted because of the last lens 26/27 of the first lens group G11 and the first lens 33/34 of the second lens group.

It is advantageous when the catadioptric reduction objective has an approximately homocentric entrance pupil. That means that the chief rays, which extend up to the optical axis, should intersect at one point on the optical axis.

Figure 4:
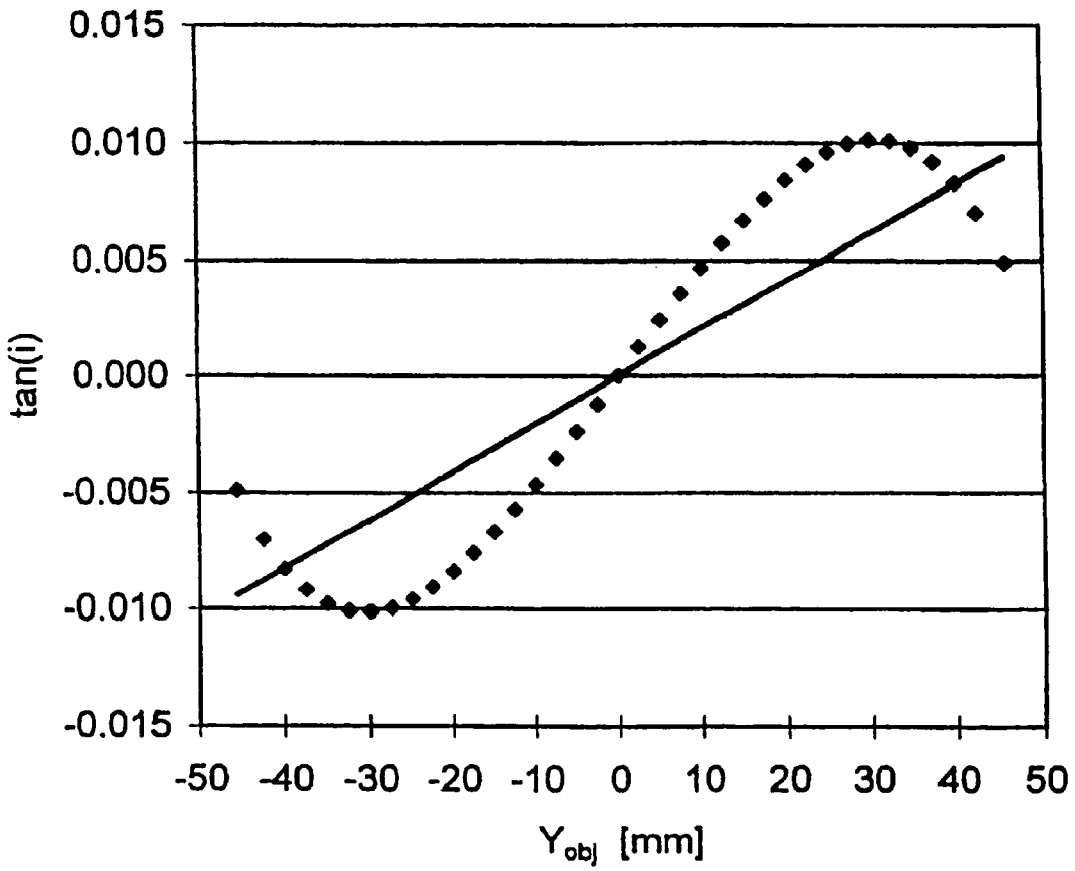
FIG. 4 shows the object end pupil function of the embodiment of FIG. 3.

In FIG. 4, the real pupil function for 37 chief ray heights is given for the embodiment of Table 2. The function runs between ±10.1 mrad and, in addition to a linear component, also has higher orders. The chief rays run convergent to the optical axis so that the entrance pupil is virtual. A fit line is shown as a solid line and is determined in that the positive and negative deviation of the object end pupil function from the fit line is minimal over the entire object field from −45.6 mm to 45.6 mm. All values of the object end pupil function lie in FIG. 4 in a region of ±4.5 mrad about the fit line. Via the linear component of the object end pupil function, a scale change can be provided by defocusing the object with simultaneous manipulation of an additional air space.

The object end field lens group FL1 having the surfaces 2 to 17 has an aspheric surface 12 in order to be able to influence the object end pupil function. To provide a pupil function having a dominant linear component with an object diameter of 91.2 mm and an object end numerical aperture of NAO=0.2 would, without the aspherical surface 12, require additional lenses.

To control the pupil function, the field lens group FL11 is assembled from a first subgroup G111 having the surfaces 2 to 5 and a second subgroup G112 having the surfaces 6 to 19. Here, the first subgroup G111 has a negative refractive power and the second subgroup G112 has a positive refractive power. To mount the aspheric surface 12 in the second subgroup G112 having positive refractive power has the advantage that the amounts of higher order of the aspheric surface do not operate directly on the pupil function because of the distance to the object plane. In addition, the splitting of the beams was increased by the negative refractive power of the first subgroup G111. The lenses having the surfaces 20 to 27 form a third subgroup G113 having negative refractive power which already serves to expand the beam.

The field lens groups FL12 (having the surfaces 41 to 48) and FL21 (having the surfaces 50 to 55) are next to the intermediate image plane IMI and likewise have aspheric surfaces 48 and 53 which, in this case, influence the image end pupil function and the distortion in the image plane IM. In the image plane IM, the distribution of the chief ray angle should be as telecentric as possible. Thus, the image end pupil function for the embodiment of Table 2 runs between ±3.6 mrad. For use in microlithography, it is adequate when the image end pupil function has values between ±10 mrad.

With the overcorrection of the image field curvature with the catadioptric partial objective L1, it is not necessary to provide a narrowed beam path for Petzval correction within the dioptric partial objective L2. In this way, the lens diameters remain limited. The maximum lens diameters in the partial objective L2 is 116.5 mm at surface 62. In the first partial objective L1 too, the lens diameters are low in order to reduce the aperture obscuration. The largest lens in the catadioptric partial objective L1 is in the lens group G112 with a diameter of 130.4 mm. The mirror diameters can be held to less than 700 mm via the aspheric surfaces 27 and 33, which are close to the mirror, with an aperture obscuration of 20%. In this way, the concave mirror M1 has a diameter of 691.5 mm and the concave mirror M2 has a diameter of 663.0 mm.

The lateral aberrations of the aperture rays are only inadequately corrected with the intermediate imaging of the catadioptric partial objective L1. The large inner coma is clearly visible in FIG. 3. The drawn-in marginal rays for the object point at $Y_{min}$=−45.6 mm run in the intermediate image plane IMI between optical axis and chief ray. The distance of the marginal rays to the chief ray is 7 mm in the intermediate image plane IMI. The correction of the image errors, which are introduced by the catadioptric partial objective L1, takes place in the refractive partial objective L2. The aspherical lens surfaces 66 and 78 are especially effective for the correction of spherical aberration, oblique spherical aberration and coma. Their position is so selected that the chief ray heights have almost the same absolute value. Thus, a principal ray, which emanates from $Y_{min}$=−45.6 mm, has a beam height of 8.65 mm at the surface 66 and has a ray height of −9.59 mm at surface 78. The two meniscus lenses 70/71 and 73/74 are advantageous for correction and are arranged convex to the pupil plane AS2.

For a small aperture obscuration, the image field can be very well corrected with the combination of the catadioptric partial objective L1 and the refractive partial objective L2 and with the targeted use of aspherical surfaces. As an index for the quality of the objective, the wavefront can be considered within the image field of 22.8 mm diameter and with the image end numerical aperture of NA=0.8 with the aid of a polychromatic simulation. The root mean square (RMS) values of the wavefront deviations for a light source at 157.63 nm with a bandwidth of 1.2 pm are less than 8 mλ within the entire image field. These slight wavefront deviations can, inter alia, be explained with the excellent correction of image focal surface and spherical aberration.

Figure 6:
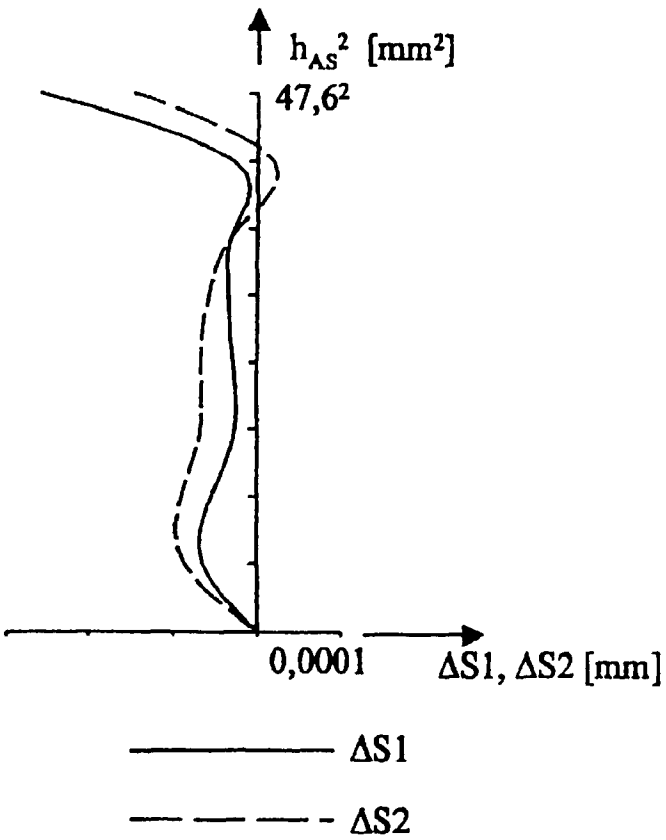
FIG. 6 shows the trace of the spherical aberration for the embodiment shown in FIG. 3 for the wavelength λ32 157.63 nm and λ=157.64 nm.
Figure 5:
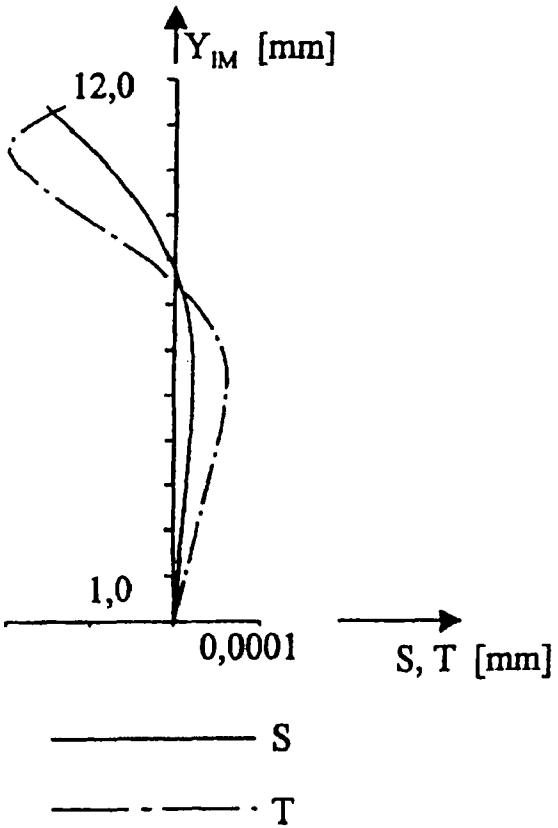
FIG. 5 shows the trace of the tangential and sagittal focal surfaces for the embodiment shown in FIG. 3.

In FIG. 5, the traces of the sagittal and tangential focal surfaces within the image field are shown. The sagittal image focal surface S is shown with the solid line and the tangential image focal surface T is shown with a dot-dash line. The offset of the image surfaces with respect to the Gaussian image plane is less than 1 μm and is a maximum of 200 nm for the tangential image surface. FIG. 6 shows the trace of the spherical aberration ΔS for the wavelengths $\lambda_1$=157.63 nm ($\Delta S_1$ solid line) and $\lambda_2$=157.64 nm ($\Delta S_2$ broken line). The spherical aberration ΔS of the aperture rays is plotted as a function of the square of the ray height $h_{AS}$ in the system diaphragm AS2. Over the entire opening of the objective, the values for the spherical aberration ΔS are less than 1 μm and, in the first embodiment, they are less than 260 nm. The chromatic longitudinal aberration for the two wavelengths at a distance of 10 pm is less than 0.1 nm. The Gaussian aberration for the two wavelengths is a maximum of 110 nm.

To achieve a field-independent aperture obscuration, it is advantageous to provide a masking device also in the refractive partial objective L2. The pupil plane AS2 in the refractive partial objective L2 has a positive curvature and the chief rays intersect the optical axis between surfaces 69 and 70. For this reason, the masking device should be placed between surfaces 69 and 70. The size of the masking device is to be so selected that the aperture obscuration, which is caused by the mirror holes, is increased only so far that, for each field point, an aperture obscuration results which is the same size and centered to the chief ray. A rod can serve as a holder for the masking device. The rod runs along the optical axis and is attached to the lens surfaces 69 and 70. It is also possible to apply the masking directly to a lens surface which is close to the intersect point of the chief rays with the optical axis such as surface 70.

Figure 7:
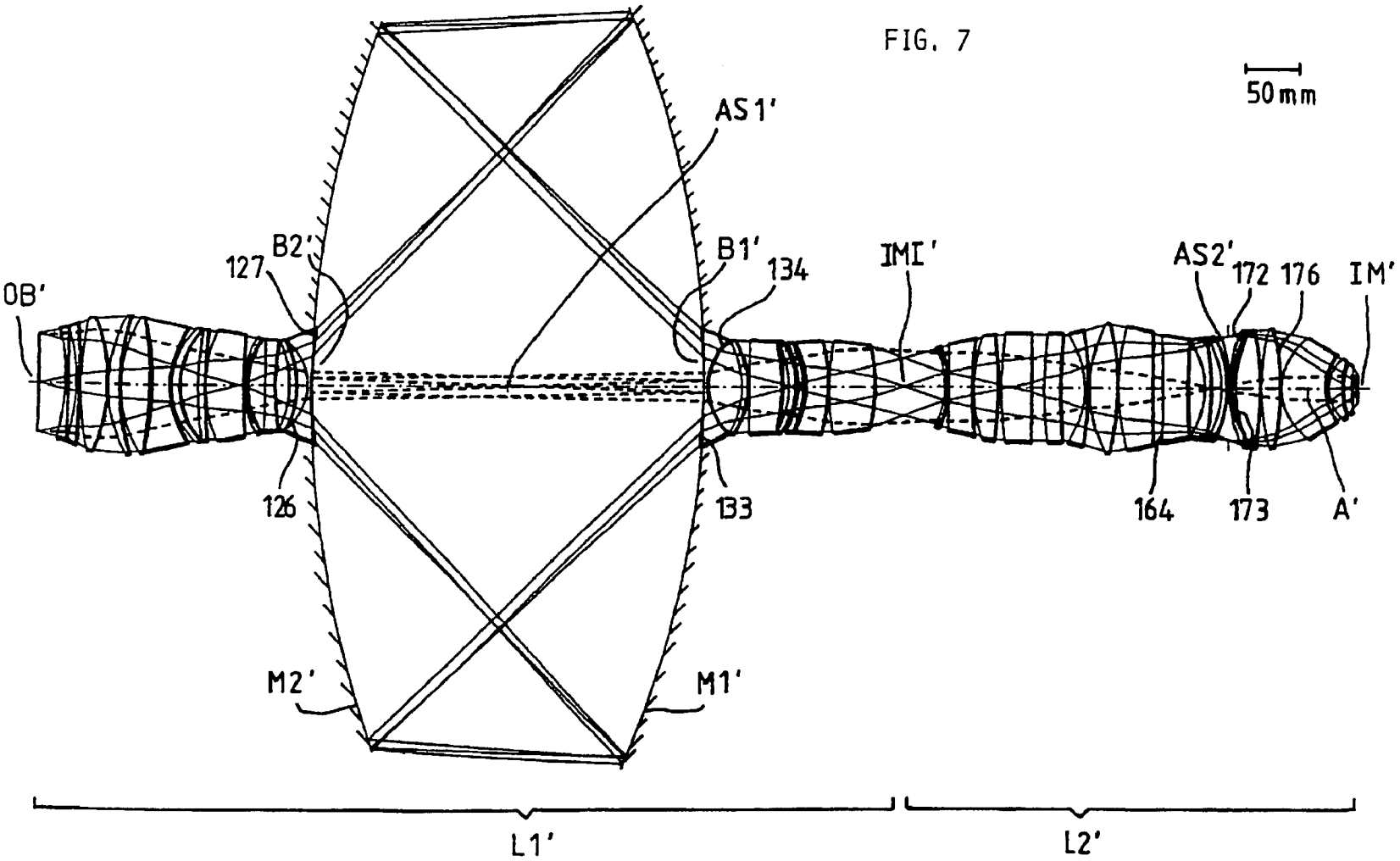
FIG. 7 is a section view taken through the lenses of a catadioptric reduction objective according to another embodiment of the invention.

FIG. 7 shows a further embodiment for a catadioptric reduction objective according to the invention. The optical data of the objective are shown in Table 3. The magnification ratio, image diameter and numerical aperture all have the same values as in the first embodiment. The aperture obscuration and the outer dimensions are also comparable. The differences to the first embodiment are in the gas charge, the lenses close to the mirror having negative refractive power and the use of a double asphere in the refractive partial objective.

The lens and mirror intermediate spaces are flushed with helium in the second embodiment. The gas charge with helium affords the advantage that the pressure and temperature dependency of the refractive index with helium in comparison to nitrogen is less by a factor of 10. Thus, the temperature coefficient of the refractive index dn/dT at $\lambda$=157.6 nm, T=0° C. and p=1013 mbar for nitrogen is $-1.2\cdot10^{-6}$/K and for helium is $-0.14\cdot10^{-6}$/K, the pressure coefficient of the refractive index dn/dp for nitrogen is $-0.34\cdot10^{-6}$/mbar and, for helium, is $-0.036\cdot10^{-6}$/mbar. In the large volumes between the concave mirrors M1' and M2', temperature gradients, which occur during the irradiation, lead to convection. For materials with temperature-dependent refractive indices, convection causes a time-dependent deformation of the wavefronts which cannot be corrected. It is therefore advantageous to fill the space between the mirrors with a gas having minimal temperature dependency of the refractive index.

The number of lenses is to be held as low as possible in order to prevent transmission losses because of reflections at the lens surfaces. Thus, in the second embodiment, the two lenses of negative refractive power (24/25, 26/27, 33/34 and 35/36) before and after the concave mirrors of the first embodiment can be combined to one negative lens (126/127 and 133/134) each before and after the mirrors. The negative refractive power of these lenses (126/127 and 133/134) must be increased in order to obtain a ray expansion of 3.567 for the marginal ray and an aperture obscuration for an object point on the optical axis of 18%. This is, on the one hand, possible with a larger aperture ratio of lens height $h_{max}$ to lens radius R. Thus, for surface 126, the quotient $h_{126}^{max}/R_{126}$=0.814 and, for surface 134, the quotient is $h_{134}^{max}/R_{134}$=0.800. On the other hand, the angle of incidence at the lens surfaces 127 and 133, which face toward the mirrors, was increased. In the second embodiment, the sine of the angle of incidence with respect to the surface normal in the optically thinner medium for the marginal ray for an object point on the optical axis on the surface 127 is sine($i_{127}^{RD}$)=0.802 and, on the surface 133, sine($i_{133}^{RD}$)=0.748.

It is advantageous in the refractive partial objective L2' to provide a double asphere on the surfaces 172 and 173 in order to obtain a similarly good wavefront correction within the image field for the second embodiment as in the first embodiment. With the adjacent aspheric surfaces in proximity to the system pupil plane AS2', the spherical aberration and the sine condition can be well corrected simultaneously. The double aspheres as a correction means can be used also in purely refractive and catadioptric objectives having a non-centered arrangement. The two aspheric surfaces can even form the forward side and the rear side of an individual lens. For manufacturing reasons, it is however advantageous to arrange two lenses each having an aspheric surface so that the aspheric surfaces are adjacent.

With the double asphere (172, 173) and the aspheric surfaces 164 and 176 arranged forward and rearward of the aperture stop AS2', adequate correction means are available in order, with a modest use of material, to correct the wavefront deviation within an image field of 22.8 mm diameter and for an image end numerical aperture of NA=0.8 to less than 8 m$\lambda$. The polychromatic simulation was carried out with a light source at 157.6 nm and a bandwidth of 1.2 pm.

The examples show the combination of a coaxial catadioptric objective with a dioptric partial objective. Other combinations such as with two dioptric partial objectives forward and rearward of the catadioptric partial objective are also possible in the context of the invention.

Figure 8:
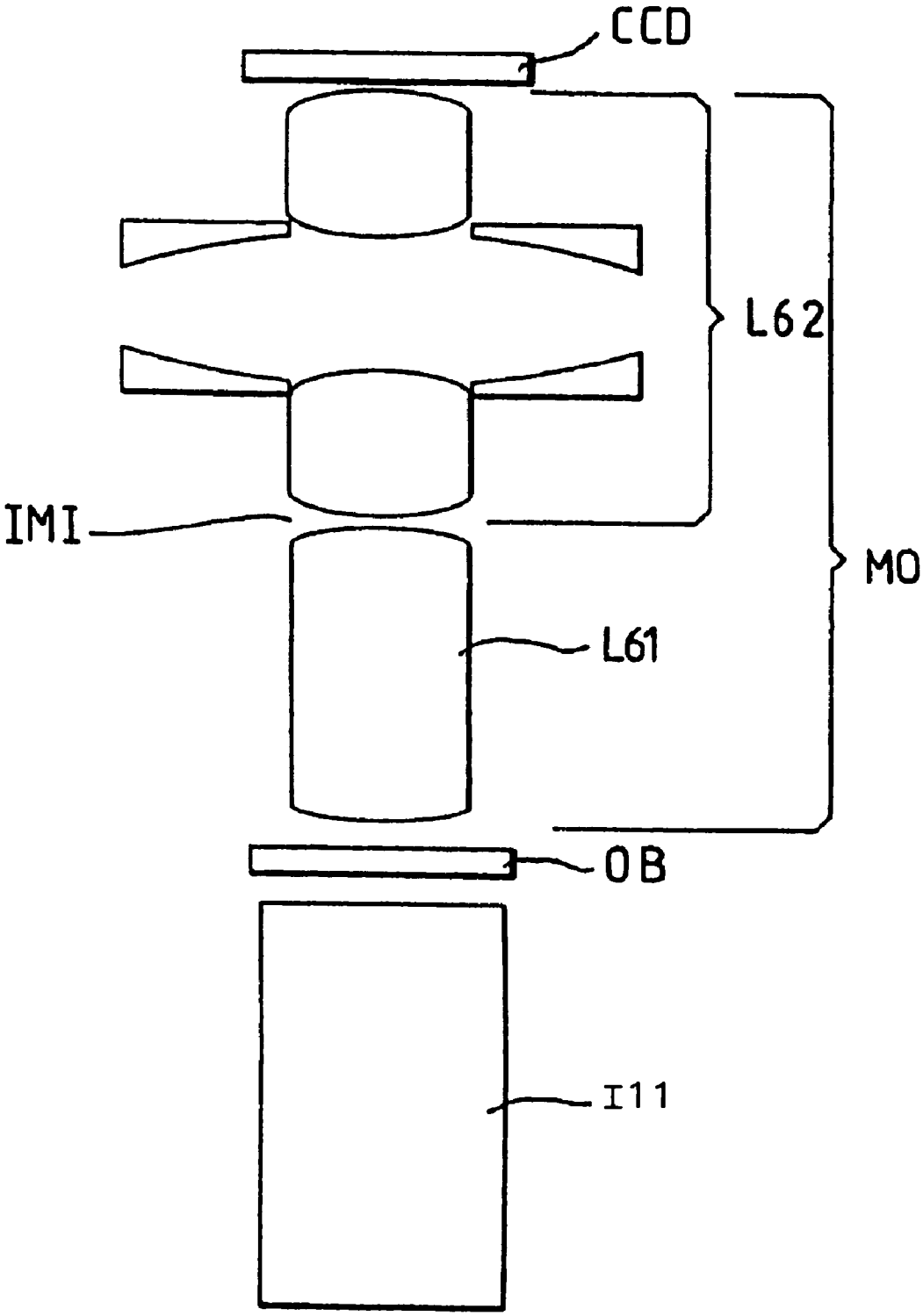
FIG. 8 is a schematic representation of a microscope incorporating a microscope objective according to the invention; and, FIG. 9 is a schematic of a microlithographic projection exposure apparatus according to an embodiment of the invention for producing microstructured components.

The schematic representation of FIG. 8 shows a microscope having a microscope objective MO in accordance with the invention. A dioptric partial objective L61 follows the object OB. The object OB is imaged magnified in the intermediate image plane IMI with the aid of the dioptric partial objective L61. A catadioptric objective L62 leads to a nearly 1:1 imaging of the intermediate image plane IMI on an image detector CCD. The design of the microscope objective MO corresponds, in principle, to the embodiments of FIGS. 3 or 7, only that the optical components are arranged in the reverse sequence. In order to increase magnification and the object end numerical aperture, the size of the object field can be reduced. An ocular for visual observation can be utilized in the lieu of an image detector CCD. The object OB is illuminated in transmission with the illuminating system 111.

Figure 9:
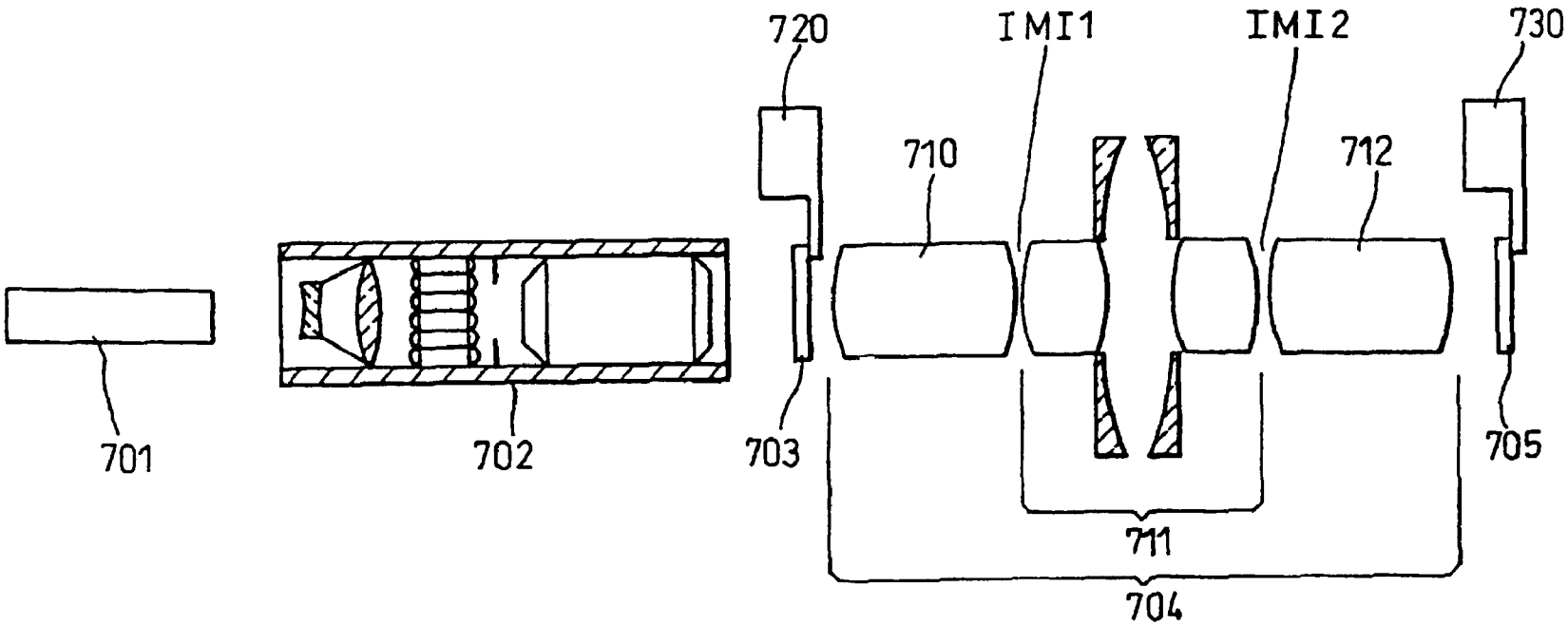

A microlithographic projection exposure apparatus for producing microstructured components is shown schematically in FIG. 9. The apparatus includes a light source 701, an illuminating system 702, a structure mask 703, a catadioptric reduction objective 704 and an object 705 to be exposed. As a light source 701, an excimer laser for wavelengths of less than 250 nm can, for example, be used. In the illuminating system 702, the following are provided: optical components for beam shaping (such as cylinder lenses) and optical components for beam homogenization (for example, a honeycomb condenser) and optical components for the correct illumination of the structure mask and the entrance pupil of the projection objective 704 (such as a field lens group). The mask holder 720 functions for positioning and for changing the structure mask 703. The catadioptric reduction objective includes, in this case, two intermediate images IMI1 and IMI2. The partial objectives 710 and 712 are designed dioptric and the partial objective 711 is configured as catadioptric. The catadioptric partial objective 711 leads to a nearly 1:1 imaging and corresponds, as to design, to a catadioptric component objective from the first embodiment shown in FIG. 3 or the second embodiment shown in FIG. 7. It is advantageous when the magnification ratio of the reduction objective 704 is provided in equal parts by the dioptric partial objectives 710 and 712. It is understood that, as a reduction objective, also an objective corresponding to the first and second embodiment can be used. The object 705 to be illuminated can, for example, be a silicon wafer coated with photoresist. A holding device 730 is specified for positioning and exchanging the silicon wafer.

It is understood that the foregoing description is that of the preferred embodiments of the invention and that various changes and modifications may be made thereto without departing from the spirit and scope of the invention as defined in the appended claims.

TABLE 1

| SF | RADII | THICKESSES | GLASSES | |
|---|---|---|---|---|
| 0 | Object | | | |
| 1 | −152.31391 | 9.3670 | SUPRA1 | |
| 2 | −934.28326 | 17.0479 | | |
| 3 | −258.50662 | 17.9979 | SUPRA1 | |
| 4 | −144.13579 | 1.5242 | | |
| 5 | 154.21865 | 34.9172 | SUPRA1 | |
| 6 | −1044.16454 | 50.7402 | | |
| 7 | −368.80081 | 10.1606 | SUPRA1 | Asphere on Surface 21 |
| 8 | 238.39923 | 2.8591 | | |
| 9 | 138.64466 | 18.7404 | SUPRA1 | |
| 10 | 312.00878 | 44.3518 | | C 1 = −.1984860500E−10 |
| 11 | −122.26492 | 12.8011 | SUPRA1 | C 2 = −.8471592100E−16 |

TABLE 1-continued

| SF | RADII | | THICKESSES | GLASSES | |
|---|---|---|---|---|---|
| 12 | −126.81758 | | 23.6934 | | C 3 = −.1338734300E−21 |
| 13 | 177.47680 | | 19.3377 | SUPRA1 | C 4 = .1383973100E−27 |
| 14 | 11788.39412 | | 15.9136 | | C 5 = .1716228700E−32 |
| 15 | −172.90112 | | 7.5815 | SUPRA1 | C 6 = .4845464500E−38 |
| 16 | 295.02570 | | 40.3349 | | C 7 = −.3305365300E−44 |
| 17 | 149.52872 | | 16.3659 | SUPRA1 | |
| 18 | 134.69462 | | 72.7792 | | |
| 19 | −79.93868 | | 10.3887 | SUPRA1 | |
| 20 | −1129.04446 | | 361.0000 | | |
| 21 | −981.42317 | AS | −295.0000 | | |
| 22 | Infinity Diaphragm | | −215.0000 .0000 | | Asphere on Surface 23 |
| 23 | 1113.03904 | AS | 500.6296 | | |
| 24 | 226.60310 | | 8.2622 | SUPRA1 | C 1 = .1686460500E−10 |
| 25 | 68.17289 | | 114.8808 | | C 2 = −.4430448700E−16 |
| 26 | −91.66030 | | 20.9850 | SUPRA1 | C 3 = −.1503908600E−21 |
| 27 | −111.26948 | | 4.2440 | | C 4 = .2530123600E−27 |
| 28 | −1008.42184 | | 16.6387 | SUPRA1 | C 5 = −.7105016500E−35 |
| 29 | −119.24333 | | 127.0374 | | C 6 = −.2345880200E−38 |
| 30 | −105.29899 | | 8.7290 | SUPRA1 | C 7 = .3712453500E−43 |
| 31 | −151.29067 | | .0532 | | |
| 32 | 6408.14692 | | 13.0429 | SUPRA1 | |
| 33 | −304.40400 | | 26.5391 | | |
| 34 | 115.05002 | | 19.9112 | SUPRA1 | |
| 35 | 113.02003 | | 18.2856 | | |
| 36 | 480.50139 | | 16.6611 | SUPRA1 | |
| 37 | −425.21265 | | 25.4688 | | |
| 38 | −154.46333 | | 14.1991 | SUPRA1 | |
| 39 | −240.64362 | | 8.7927 | | |
| 40 | 289.04838 | | 24.5556 | SUPRA1 | |
| 41 | −469.53160 | | 22.0894 | | |
| 42 | −127.91442 | | 14.2424 | SUPRA1 | |
| 43 | −179.26273 | | 67.4834 | | |
| 44 | 4904.05552 | | 29.6764 | SUPRA1 | |
| 45 | −179.72857 | | 8.1164 | | |
| 46 | −152.96898 | | 13.7764 | SUPRA1 | |
| 47 | −203.54702 | | 12.9619 | | |
| 48 | −127.62811 | | 14.1864 | SUPRA1 | |
| 49 | −139.16594 | | .4118 | | |
| 50 | Infinity | | 8.0000 | SUPRA1 | |
| 51 | Infinity | | 4.0000 | | |
| 52 | Infinity | | .0001 | | |
| 53 | 121.70233 | | 15.3662 | SUPRA1 | |
| 54 | 109.92284 | | 36.1371 | | |
| 55 | 219.24113 | | 30.1687 | SUPRA1 | |
| 56 | −303.41760 | | 31.5237 | | |
| 57 | 73.58279 | | 65.3446 | SUPRA1 | SUPRA1 = Quartz Glass |
| 58 | 43.81552 | | 3.1551 | | |
| 59 | 41.37557 | | 28.5961 | SUPRA1 | |
| 60 | 604.77330 | | .6625 | | |
| 61 | Image Plane | | | | |

TABLE 2

| Surface | Radius | Asphere | Mirror | Thickness | Material | Diameter |
|---|---|---|---|---|---|---|
| OB | INFINITE | | | 26.122 | $N_2$ | 100.0 |
| 2 | −226.258 | | | 4.000 | CAF2 | 99.7 |
| 3 | 1694.910 | | | 7.361 | N2 | 104.1 |
| 4 | −210.020 | | | 4.023 | CAF2 | 104.1 |
| 5 | −4263.571 | | | 0.750 | N2 | 110.8 |
| 6 | 353.550 | | | 30.488 | CAF2 | 117.3 |

TABLE 2-continued

| Surface | Radius | Asphere | Mirror | Thickness | Material | Diameter |
|---|---|---|---|---|---|---|
| 7 | −137.865 | | | 0.750 | N2 | 122.7 |
| 8 | 116.889 | | | 15.735 | CAF2 | 130.4 |
| 9 | 177.655 | | | 5.923 | N2 | 127.8 |
| 10 | 118.343 | | | 32.491 | CAF2 | 126.6 |
| 11 | −373.347 | | | 2.660 | N2 | 122.1 |
| 12 | −231.515 | A | | 7.862 | CAF2 | 122.1 |
| 13 | 88.994 | | | 0.864 | N2 | 107.7 |
| 14 | 77.637 | | | 8.155 | CAF2 | 108.4 |
| 15 | 81.208 | | | 20.608 | N2 | 105.4 |
| 16 | 221.890 | | | 9.012 | CAF2 | 105.5 |
| 17 | 163.578 | | | 2.429 | N2 | 103.7 |
| 18 | 110.213 | | | 27.605 | CAF2 | 104.6 |
| 19 | −1324.253 | | | 9.444 | N2 | 100.5 |
| 20 | 97.719 | | | 4.000 | CAF2 | 89.4 |
| 21 | 64.603 | | | 14.158 | N2 | 83.4 |
| 22 | 684.267 | A | | 5.079 | CAF2 | 83.4 |
| 23 | 216.155 | | | 24.074 | N2 | 82.3 |
| 24 | −57.188 | | | 2.000 | CAF2 | 82.3 |
| 25 | −92.747 | | | 5.064 | N2 | 87.8 |
| 26 | −72.557 | | | 2.000 | CAF2 | 88.3 |
| 27 | 344.860 | A | | 189.734 | N2 | 105.0 |
| M1 | −813.737 | A | S | −189.734 | N2 | 691.5 |
| AS1 | INFINITE | | | −189.734 | N2 | 677.8 |
| M2 | 910.975 | A | S | 189.734 | N2 | 663.0 |
| 33 | −416.373 | A | | 2.000 | CAF2 | 106.4 |
| 34 | 65.887 | | | 4.948 | N2 | 87.8 |
| 35 | 80.253 | | | 2.000 | CAF2 | 87.3 |
| 36 | 54.610 | | | 31.217 | N2 | 81.7 |
| 37 | −84.333 | | | 7.747 | CAF2 | 81.6 |
| 38 | −75.708 | | | 0.750 | N2 | 83.7 |
| 39 | −1017.773 | | | 27.565 | CAF2 | 81.7 |
| 40 | −155.591 | | | 5.282 | N2 | 79.9 |
| 41 | −81.310 | | | 8.228 | CAF2 | 79.9 |
| 42 | −68.211 | | | 1.949 | N2 | 80.7 |
| 43 | −78.791 | | | 6.095 | CAF2 | 77.1 |
| 44 | −108.111 | | | 2.600 | N2 | 77.2 |
| 45 | −81.487 | | | 21.352 | CAF2 | 77.2 |
| 46 | −143.068 | | | 0.938 | N2 | 80.4 |
| 47 | 199.620 | | | 40.095 | CAF2 | 79.0 |
| 48 | −145.642 | A | | 20.000 | N2 | 71.9 |
| IM1 | INFINITE | | | 44.528 | N2 | 67.0 |
| 50 | −75.128 | | | 4.117 | CAF2 | 69.0 |
| 51 | −90.888 | | | 0.971 | N2 | 72.4 |
| 52 | −632.737 | | | 22.418 | CAF2 | 76.6 |
| 53 | 408.536 | A | | 0.900 | N2 | 87.2 |
| 54 | 147.577 | | | 23.337 | CAF2 | 91.9 |
| 55 | −284.699 | | | 1.148 | N2 | 94.9 |
| 56 | 544.076 | | | 28.648 | CAF2 | 96.3 |
| 57 | −917.060 | | | 10.169 | N2 | 97.7 |
| 58 | 1123.355 | | | 15.459 | CAF2 | 98.1 |
| 59 | 2847.866 | | | 22.266 | N2 | 98.0 |
| 60 | −84.178 | | | 4.000 | CAF2 | 98.0 |
| 61 | −351.550 | | | 0.750 | N2 | 105.7 |
| 62 | 131.866 | | | 26.379 | CAF2 | 116.5 |
| 63 | −235.338 | | | 2.325 | N2 | 116.4 |
| 64 | 222.992 | | | 31.521 | CAF2 | 111.2 |
| 65 | 38305.126 | | | 9.715 | N2 | 101.7 |
| 66 | −2322.734 | A | | 22.353 | CAF2 | 96.4 |
| 67 | 1104.047 | | | 13.909 | N2 | 88.6 |
| 68 | −81.868 | | | 7.918 | CAF2 | 88.6 |
| 69 | −177.471 | | | 8.961 | N2 | 91.5 |
| 70 | −86.806 | | | 6.077 | CAF2 | 91.5 |
| 71 | −96.333 | | | 1.537 | N2 | 94.4 |
| AS2 | INFINITE | | | 0.750 | N2 | 95.3 |
| 73 | 130.184 | | | 4.810 | CAF2 | 103.5 |
| 74 | 97.753 | | | 2.761 | N2 | 104.4 |
| 75 | 116.560 | | | 23.022 | CAF2 | 104.4 |
| 76 | −270.739 | | | 0.750 | N2 | 105.5 |
| 77 | 194.680 | | | 18.881 | CAF2 | 107.1 |
| 78 | −210.640 | A | | 0.750 | 142 | 106.4 |
| 79 | 55.466 | | | 43.620 | CAF2 | 92.6 |
| 80 | 50.189 | | | 2.182 | N2 | 59.6 |
| 81 | 37.769 | | | 13.715 | CAF2 | 55.3 |
| 82 | 77.000 | | | 1.188 | N2 | 47.9 |
| 83 | 60.105 | | | 8.895 | CAF2 | 44.7 |
| 84 | 185.707 | | | 5.644 | N2 | 36.9 |
| IM | INFINITE | | | | N2 | 22.8 |

Asphere Equation:

$$z = \frac{\frac{1}{R}h^2}{1+\sqrt{1-(1-EX)\left(\frac{1}{R}\right)^2 h^2}} + \sum_{k=1} c_k h^{2k+2}$$

wherein:

z: Sagitta;
h: Height;
R: Radius;
EX: Eccentricity;
$C_k$: Aspheric constants.

ASPHERE AT SURFACE 12

RADIUS = 231.51455 MAXIMUM HEIGHT = 61.10
ASPHERIC PARAMETERS

EX = −2.3650089000
C 1 = .4794899400E−07
C 2 = .6604175100E−11
C 3 = −.7562978300E−15
C 4 = .6805192600E−19
C 5 = −.2666129900E−23

ASPHERE AT SURFACE 22

RADIUS = 684.26729 MAXIMUM HEIGHT = 41.80
ASPHERIC PARAMETERS

EX = .0000000000
C 1 = .1509596800E−06
C 2 = −.5120549400E−10
C 3 = −.5610431800E−14
C 4 = −.1117020200E−16
C 5 = .2518000300E−20
C 6 = −.1694764600E−23

ASPHERE AT SURFACE 27

RADIUS = 344.85984 MAXIMUM HEIGHT = 52.50
ASPHERIC PARAMETERS

EX = 7.0085930000
C 1 = −.5923208000E−07
C 2 = .1890459800E−10
C 3 = −.4378968800E−15
C 4 = −.5239005100E−18
C 5 = .1912278200E−21

ASPHERE AT SURFACE 29

RADIUS = −813.73677 MAXIMUM HEIGHT = 345.80
ASPHERIC PARAMETERS

EX = 1.0459455000
C 1 = −.4485550100E−10
C 2 = −.1176505800E−15
C 3 = −.1049527100E−20
C 4 = −.8619328500E−26
C 5 = −.2274167800E−31
C 6 = −.3345014000E−37
C 7 = −.3286498200E−43

ASPHERE AT SURFACE 31

RADIUS = 910.97468 MAXIMUM HEIGHT = 331.50
ASPHERIC PARAMETERS

EX = .9036275200
C 1 = .6193779100E−10
C 2 = −.1344616200E−15
C 3 = −.1509012800E−20

-continued

C 4 = −.7421992700E−26
C 5 = −.4535969900E−31
C 6 = .1986463200E−36
C 7 = −.1449901900E−41

ASPHERE AT SURFACE 33

RADIUS = −416.37282 MAXIMUM HEIGHT = 53.30
ASPHERIC PARAMETERS

EX = 13.3142580000
C 1 = .6027181300E−07
C 2 = .2450300200E−10
C 3 = −.4142498400E−14
C 4 = .3917454300E−18
C 5 = −.1088457000E−25

ASPHERE AT SURFACE 48

RADIUS = −145.64247 MAXIMUM HEIGHT = 36.00
ASPHERIC PARAMETERS

EX = −.4376678300
C 1 = −.2590488300E−07
C 2 = .4696937200E−12
C 3 = .7666469100E−16
C 4 = .8507764300E−21
C 5 = −.1186245400E−25

ASPHERE AT SURFACE 53

RADIUS = 408.53641 MAXIMUM HEIGHT = 43.60
ASPHERIC PARAMETERS

EX = −14.2359470000
C 1 = .9773912300E−07
C 2 = −.6627558800E−11
C 3 = −.2537861300E−15
C 4 = −.1281961700E−18
C 5 = −.1182417800E−25

ASPHERE AT SURFACE 66

RADIUS = −2322.73355 MAXIMUM HEIGHT = 48.20
ASPHERIC PARAMETERS

EX = −504.9485600000
C 1 = −.2616677600E−07
C 2 = −.3063442300E−10
C 3 = .3964984700E−14
C 4 = −.1714421100E−17
C 5 = −.1187390103E−25

ASPHERE AT SURFACE 78

RADIUS = −210.64008 MAXIMUM HEIGHTS = 53.20
ASPHERIC PARAMETERS

EX = 6.3257878000
C 1 = .4095943500E−07
C 2 = .1712273600E−12
C 3 = .9639448600E−15
C 4 = −.2847604400E−18
C 5 = .7274168800E−23

TABLE 3

| Surface | Radius | Asphere | Minor | Thickness | Material | Diameter |
|---|---|---|---|---|---|---|
| OB' | INFINITY | | | 26.122 | He | 50.0 |
| 102 | −204.364 | | | 4.000 | CaF2 | 49.7 |
| 103 | −13179.432 | | | 7.350 | He | 51.9 |
| 104 | −184.672 | | | 4.011 | CaF2 | 51.9 |
| 105 | −1226.241 | | | 0.753 | He | 55.3 |
| 106 | 259.607 | | | 26.956 | CaF2 | 60.1 |
| 107 | −147.776 | | | 0.750 | He | 61.4 |
| 108 | 125.704 | | | 11.380 | CaF2 | 63.6 |

TABLE 3-continued

| Surface | Radius | Asphere | Minor | Thickness | Material | Diameter |
|---|---|---|---|---|---|---|
| 109 | 178.234 | | | 0.750 | He | 62.7 |
| 110 | 111.880 | | | 29.403 | CaF2 | 62.4 |
| 111 | −380.095 | | | 3.030 | He | 60.9 |
| 112 | −235.417 | A | | 17.184 | CaF2 | 60.9 |
| 113 | 82.808 | | | 0.750 | He | 51.7 |
| 114 | 67.123 | | | 8.979 | CaF2 | 52.5 |
| 115 | 69.627 | | | 17.234 | He | 50.6 |
| 116 | 281.120 | | | 6.567 | CaF2 | 50.6 |
| 117 | 272.393 | | | 0.758 | He | 50.2 |
| 118 | 115.088 | | | 36.934 | CaF2 | 50.2 |
| 119 | 389.484 | | | 0.750 | He | 45.5 |
| 120 | 88.823 | | | 4.097 | CaF2 | 43.6 |
| 121 | 73.172 | | | 15.989 | He | 41.7 |
| 122 | −1528.771 | | | 10.066 | CaF2 | 41.4 |
| 123 | 217.517 | | | 13.370 | He | 40.3 |
| 124 | −89.601 | | | 7.977 | CaF2 | 40.3 |
| 125 | −76.531 | | | 9.154 | He | 41.2 |
| 126 | −50.697 | | | 4.001 | CaF2 | 41.2 |
| 127 | 259.195 | A | | 189.734 | He | 52.7 |
| M1' | −814.100 | A | S | −189.734 | He | 349.3 |
| AS1' | INFINITY | | | −189.734 | He | 342.6 |
| M2' | 911.247 | A | S | 189.734 | He | 335.0 |
| 133 | −276.266 | A | | 4.000 | CaF2 | 54.0 |
| 134 | 52.152 | | | 32.685 | He | 41.7 |
| 135 | −80.264 | | | 6.728 | CaF2 | 41.7 |
| 136 | −77.215 | | | 0.850 | He | 42.8 |
| 137 | −1419.828 | | | 32.679 | CaF2 | 41.9 |
| 138 | −147.648 | | | 5.801 | He | 41.0 |
| 139 | −78.453 | | | 7.489 | CaF2 | 41.0 |
| 140 | −70.298 | | | 0.750 | He | 41.5 |
| 141 | −84.334 | | | 6.166 | CaF2 | 40.2 |
| 142 | −98.563 | | | 2.147 | He | 40.3 |
| 143 | −80.891 | | | 21.397 | CaF2 | 40.3 |
| 144 | −151.520 | | | 0.750 | He | 42.0 |
| 145 | 242.014 | | | 45.863 | CaF2 | 41.3 |
| 146 | −145.419 | A | | 22.791 | He | 37.5 |
| IMI' | INFINITY | | | 43.060 | He | 33.2 |
| 148 | −77.276 | | | 4.000 | CaF2 | 34.7 |
| 149 | −95.689 | | | 0.751 | He | 36.4 |
| 150 | −894.688 | | | 22.703 | CaF2 | 38.6 |
| 151 | 427.406 | A | | 0.750 | He | 43.9 |
| 152 | 143.694 | | | 24.676 | CaF2 | 46.4 |
| 153 | −346.670 | | | 2.353 | He | 47.9 |
| 154 | 347.126 | | | 29.393 | CaF2 | 48.8 |
| 155 | −10246.191 | | | 11340 | He | 49.1 |
| 156 | 479.165 | | | 15.800 | CaF2 | 49.3 |
| 157 | 634.264 | | | 23.350 | He | 48.8 |
| 158 | −81.257 | | | 4.000 | CaF2 | 48.8 |
| 159 | −299.826 | | | 0.750 | He | 52.8 |
| 160 | 128.827 | | | 26.561 | CaF2 | 58.6 |
| 161 | −250.110 | | | 0.783 | He | 58.5 |
| 162 | 213.461 | | | 33.162 | CaF2 | 56.1 |
| 163 | −4384.454 | | | 9.042 | He | 51.0 |
| 164 | −1171.671 | A | | 24.405 | CaF2 | 48.4 |
| 165 | 1409.721 | | | 14.203 | He | 44.3 |
| 166 | −79.418 | | | 7.954 | CaF2 | 44.3 |
| 167 | −174.125 | | | 8.406 | He | 45.9 |
| 168 | −85.986 | | | 6.344 | CaF2 | 45.9 |
| 169 | −94.556 | | | 0.750 | He | 47.5 |
| AS2' | INFINITY | | | 0.750 | He | 48.0 |
| 171 | 128.150 | | | 4.001 | CaF2 | 52.4 |
| 172 | 99.397 | A | | 2.565 | He | 52.8 |
| 173 | 116.720 | A | | 23.743 | CaF2 | 52.8 |
| 174 | −265.459 | | | 0.750 | He | 53.3 |
| 175 | 220.793 | | | 18.648 | CaF2 | 53.8 |
| 176 | −192.915 | A | | 0.751 | He | 53.4 |
| 177 | 55.415 | | | 43.719 | CaF2 | 46.3 |
| 178 | 48.232 | | | 2.666 | He | 29.6 |
| 179 | 37.843 | | | 13.583 | CaF2 | 27.5 |
| 180 | 77.482 | | | 0.896 | He | 23.8 |
| 181 | 61.588 | | | 9.014 | CaF2 | 22.5 |
| 182 | 233.027 | | | 5.544 | He | 18.7 |
| IM' | INFINITY | | | | He | 11.6 |

Asphere Equation:

$$z = \frac{\frac{1}{R}h^2}{1+\sqrt{1-(1-EX)\left(\frac{1}{R}\right)^2 h^2}} + \sum_{k=1} c_k h^{2k+2}$$

wherein:

z: Sagitta;

h: Height;

R: Radius;

EX: Eccentricity;

$C_k$: Aspheric constants.

ASPHERE AT SURFACE 112
RADIUS=−235.41701
ASPHERIC PARAMETERS
EX=−3.5655174000
C1=0.1594103700E−07
C2=0.9691002400E−11
C3=−0.2966744600E−15
C4=−0.7513476000E−20
C5=0.2320168900E−23

ASPHERE AT SURFACE 127
RADIUS=259.19472
ASPHERIC PARAMETERS
EX=10.5339150000
C1=−0.7249663100E−07
C2=0.2029178100E−10
C3=0.1880266700E−14
C4=−0.8749673900E−18
C5=−0.1693100300E−21

ASPHERE AT SURFACE 129
RADIUS=−814.09969
ASPHERIC PARAMETERS
EX=1.0403493000
C1=−0.4617273800E−10
C2=−0.1656492900E−15
C3=−0.7032735900E−21
C4=−0.8196216800E−26
C5=−0.4593606600E−31
C6=0.2130418500E−36
C7=−0.5288525800E−42

ASPHERE AT SURFACE 131
RADIUS=911.24655
ASPHERIC PARAMETERS
EX=0.9046279400
C1=0.6158933500E−10
C2=−0.9961809700E−16
C3=−0.1507405000E−20
C4=−0.5950193100E−26
C5=−0.8479544000E−31
C6=0.5389473000E−36
C7=−0.2457441000E−41

ASPHERE AT SURFACE 133
RADIUS=−276.26621
ASPHERIC PARAMETERS
EX=17.9914210000
C1=0.7160629600E−07
C2=0.2347805100E−10
C3=−0.4079465600E−14
C4=0.3665147100−18
C5=−0.1164774600E−25

ASPHERE AT SURFACE 146
RADIUS=−145.41928
ASPHERIC PARAMETERS
EX=−0.6001124400
C1=−0.3516934200E−07
C2=−0.6766352800E−13
C3=0.3886201400E−16
C4=0.3232846800E−19
C5=−0.1183342300E−25
ASPHERE AT SURFACE 151
RADIUS=427.40595
ASPHERIC PARAMETERS
EX=−5.9773913000
C1=0.7201853700E−07
C2=−0.2977626800E−11
C3=−0.4822696100E−15
C4=−0.3850785300E−19
C5=−0.1180343900E−25
ASPHERE AT SURFACE 164
RADIUS=−1171.67140
ASPHERIC PARAMETERS
EX=−43.9450720000
C1=−0.1296719200E−07
C2=−0.4906161200E−10
C3=0.4653793500E−14
C4=−0.1412806100E−17
C5=−0.1183234800E−25
ASPHERE AT SURFACE 172
RADIUS=99.39708
ASPHERIC PARAMETERS
EX=0.0000000000
C1=0.5054268300E−08
C2=0.4397062000E−11
C3=0.1157142500E−14
C4=0.0000000000E+00
C5=0.6830163000E−31
C6=−0.1798952100E−25
ASPHERE AT SURFACE 173
RADIUS=116.71967
ASPHERIC PARAMETERS
EX=0.0000000000
C1=0.1364887500E−08
C2=0.3273423700E−11
C3=0.4566986300E−15
C4=0.5735576000E−18
C5=−0.7017743300E−31
C6=−0.2443449400E−25
ASPHERE AT SURFACE 176
RADIUS=−192.91501
ASPHERIC PARAMETERS
EX=4.9528308000
C1=0.3306922300E−07
C2=0.6088797000E−11
C3=0.6041457400E−15
C4=0.3208686500E−19
C5=0.6892924800E−23

What is claimed is:

1. A catadioptric objective wherein a light beam is transmitted along a light path and said catadioptric objective defining an optical axis, said catadioptric objective comprising in sequence of travel of said light beam:

a first lens group having a negative refractive power and arranged centered on said optical axis;

a first concave mirror having a central cutout and being arranged centered on said optical axis downstream of said first lens group;

a second concave mirror having a central cutout and being arranged centered on said optical axis downstream of said first concave mirror;

said first and second concave mirrors being disposed so as to face each other;

a second lens group having a negative refractive power and being arranged centered on said optical axis downstream of said second concave mirror;

said first lens group having a first plurality of lenses arranged upstream of said first concave mirror;

said second lens group having a second plurality of lenses arranged downstream of said second concave mirror; and, one of said first and second plurality of lenses having at least one aspheric lens surface,

*wherein said catadioptric objective has an object end region and an image end region and said catadioptric objective further comprising a field lens group disposed in one of said object end region and said image end region, said field lens group having said aspheric lens surface.*

2. The catadioptric objective of claim 1, p1 said first plurality of lenses including at least a first negative lens and said first lens group being devoid of any additional negative lenses between said first negative lens and said first concave mirror;

said first negative lens and any lenses between said first negative lens and said first concave mirror having an overall negative refractive power;

said second plurality of lenses including at least a second negative lens and said second lens group being devoid of any additional negative lenses between said second concave mirror and said second negative lens;

said second negative lens and any lenses between said second concave mirror and said second negative lens having an overall negative refractive power; and, said first plurality of lenses including a lens adjacent said first negative lens and said second plurality of lenses including a lens adjacent said second negative lens; and, at least one of the following lenses having at least one aspheric lens surface: said first negative lens, said lens adjacent said first negative lens, said second negative lens and said lens adjacent said second negative lens.

[3. The catadioptric objective of claim 1, wherein said catadioptric objective has an object end region and an image end region; and, said catadioptric objective further comprising a field lens group disposed in one of said object end region and said image end region; and, said field lens group having said aspheric lens surface.]

4. The catadioptric objective of claim 1, wherein said first lens group includes a first subgroup, a second subgroup and a third subgroup; said first and third subgroups having a negative refractive power and said second subgroup having a positive refractive power; and, said second subgroup having at least said one aspheric lens surface.

5. The catadioptric objective of claim 1, wherein light rays pass through said first and second lens groups in only one direction.

6. The catadioptric objective of claim 1, wherein the absolute value of the magnification ratio of said catadioptric objective lies in a range from 0.7 to 1.3.

7. The catadioptric objective of claim 1, wherein a lens or at least part of a lens of at least one of said first and second plurality of lenses lie in a geometric space between said first and second concave mirrors.

8. The catadioptric objective of claim 1, wherein at least one of said first and second lens groups includes a concave surface for which the ratio of lens height ($h_{max}$) to surface radius (R) lies in a range from $0.7<h_{max}/R<1.0$.

9. The catadioptric objective of claim 8, wherein the plurality of lenses of said one of said first and second lens groups includes a lens defining said concave surface; and, said lens defining said concave surface having an aspheric lens surface or a lens adjacent to said lens having said concave surface having an aspheric lens surface.

10. The catadioptric objective of claim 1, wherein a light beam is transmitted by said catadioptric objective and said light beam includes a marginal ray; at least one of said first and second lens groups includes at least one surface having a largest magnitude of the sine of the angle of incidence relative to the surface normal of said marginal ray in air ($|\sin(i_{peri})|$) greater by a factor of three of the numerical aperture (NA) of the object end region.

11. The catadioptric objective of claim 10, wherein said magnitude of said sine is greater by a factor of 3.5.

12. The catadioptric objective of claim 10, wherein said magnitude of said sine is greater by a factor of 3.75.

13. The catadioptric objective of claim 10, wherein said at least one surface is defined by a lens of said at least one of said first and second lens groups and said lens or a lens adjacent thereto having an aspheric lens surface.

14. The catadioptric objective of claim 1, wherein each of said central cutouts defines an aperture obscuration which is less than 35%.

15. The catadioptric objective of claim 14, wherein said aperture obscuration is less than 25%.

16. The catadioptric objective of claim 14, wherein said aperture obscuration is less than 20%.

17. The catadioptric objective of claim 1, wherein a first pupil plane is disposed in said light path between said first and second concave mirrors.

18. The catadioptric objective of claim 1, wherein a light beam is transmitted by said catadioptric objective and said light beam includes a marginal ray; one of said lenses of said first plurality of lenses being next to said first concave mirror; one of said lenses of said second plurality of lenses being next to said second concave mirror; and, for the height ($h_{G11}$) of said marginal ray on said one lens of said first plurality of lenses and for the height ($h_{G12}$) of said marginal ray on said one lens of said second plurality of lenses, the following relationship applies:

$$0.8<h_{G11}/h_{G12}<1.2.$$

19. The catadioptric objective of claim 1, wherein a light beam is transmitted by said catadioptric objective and said light beam includes an aperture ray; and, said aperture ray defining an angle $i_1$ with said optical axis upstream of said first lens group and an angle $i_2$ with said optical axis downstream of said first lens group; and, wherein the aperture expansion $$\left|\frac{\sin(i_1)}{\sin(i_2)}\right|$$

is at least 2.0.

20. The catadioptric objective of claim 19, wherein said aperture expansion is at least 3.0.

21. The catadioptric objective of claim 19, wherein said aperture expansion is dependent upon said angle $i_1$.

22. The catadioptric objective of claim 21, wherein the aperture expansion for a paraxial aperture ray is $m_P$ and the aperture expansion for a marginal ray is $m_R$; and, $m_R/m_P<1.1$.

23. The catadioptric objective of claim 22, wherein $m_R/m_P<1.05$.

24. The catadioptric objective of claim 22, wherein $m_R/m_P<1.02$.

25. The catadioptric objective of claim 1, wherein $h_{L1}$ is the maximum height of all of said lenses of said first and second plurality of lenses; $h_{M1}$ is the smaller height of said first and second concave mirrors; and, $h_{L1}/h_{M1}$ is less than ¼.

26. The catadioptric objective of claim 25, wherein $h_{L1}/h_{M1}$ is less than ⅕.

27. The catadioptric objective of claim 1, wherein said catadioptric objective has an object end region; and, the maximum deviation of the real pupil function of said object end region from a line fit through said real pupil function is less than ±10 mrad.

28. The catadioptric objective of claim 27, wherein said maximum deviation is less than ±5 mrad.

29. The catadioptric objective of claim 1, wherein all of said lenses are made of the same material.

30. The catadioptric objective of claim 29, wherein all of said lenses are made of fluoride crystal.

31. The catadioptric objective of claim 30, wherein said fluoride crystal is selected from the group consisting of $CaF_2$, $BaF_2$, $SrF_2$, LiF, NaF and KF.

32. The catadioptric objective of claim 1, wherein said first and second concave mirrors conjointly define a space therebetween containing a gas having a pressure and temperature dependency on its refractive index less than nitrogen.

33. The catadioptric objective of claim 32, wherein said gas is helium.

34. A catadioptric reduction objective wherein a light beam is transmitted along a light path and said catadioptric reduction objective comprising:

a first partial objective defining an intermediate image plane;

a second partial objective mounted downstream or upstream of said first partial objective;

said first and second partial objectives conjointly defining a common optical axis and being centered thereon;

said first partial objective being a catadioptric objective and said second partial objective being a purely refractive objective; and, said catadioptric objective including also in sequence of the travel of said light beam:

a first lens group having a negative refractive power and arranged on said optical axis;

a first concave mirror having a central cutout and being arranged on said optical axis downstream of said first lens group;

a second concave mirror having a central cutout and being arranged on said optical axis downstream of said first concave mirror;

said first and second concave mirrors being disposed so as to face each other;

a second lens group having a negative refractive power and being arranged on said optical axis downstream of said second concave mirror;

said first lens group having a first plurality of lenses arranged upstream of said first concave mirror;

said second lens group having a second plurality of lenses arranged downstream of said second concave mirror; and, one of said first and second plurality of lenses having at least one aspheric lens surface.

35. The catadioptric reduction objective of claim 34, wherein the absolute value of the magnification ratio lies in the range from 0.1 to 0.5.

36. The catadioptric reduction objective of claim 34, said refractive objective having at least one lens defining an aspheric surface.

37. The catadioptric reduction objective of claim 36, wherein a first pupil plane is disposed in said light path between said first and second concave mirrors; said refractive objective containing a second pupil plane; said refractive objective includes a third plurality of lenses defining a first aspheric surface upstream of said second pupil plane and a second aspheric surface downstream of said second pupil plane; and, wherein $h_{a1}$ is the height of a chief ray at said first aspheric surface and $h_{a2}$ is the height of a chief ray at said second aspheric surface; and, the following relationship applies:

$$0.7 < \left|\frac{h_{a1}}{h_{a2}}\right| < 1.3.$$

38. The catadioptric reduction objective of claim 37, wherein said relationship is:

$$0.8 < \left|\frac{h_{a1}}{h_{a2}}\right| < 1.2.$$

39. The catadioptric reduction objective of claim 34, said catadioptric reduction objective having two mutually adjacent aspheric lens surfaces.

40. The catadioptric reduction objective of claim 39, said two mutually adjacent aspheric lens surfaces conjointly defining a space therebetween filled with a medium having a refractive index<1.1.

41. The catadioptric reduction objective of claim 39, wherein said refractive objective includes an aperture stop (AS2'); $h_{a3}$ is the maximum ray height of chief rays at said mutually adjacent lens surfaces; and, $h_{AS}$ is the height of said aperture stop (AS2'); and, wherein the following relationship applies:

$$\frac{h_{a3}}{h_{AS}} < 0.15.$$

42. The catadioptric reduction objective of claim 41, wherein:

$$\frac{h_{a3}}{h_{AS}} < 0.10.$$

43. The catadioptric reduction objective of claim 34, wherein said refractive objective includes an object end region and an image end region; and, said refractive objective includes a field lens group in said object end region and said field lens group including an aspheric lens surface.

44. The catadioptric reduction objective of claim 34, wherein said refractive objective includes a third plurality of lenses; $h_{L2}$ is the maximum height of all of said lens elements of said catadioptric objective and said refractive objective; $h_{M2}$ is the lesser height of said first and second concave mirrors; and, wherein $h_{L2}/h_{M2}$ is less than ¼.

45. The catadioptric reduction objective of claim 44, wherein $h_{L2}/h_{M2}$ is less than ⅕.

46. The catadioptric reduction objective of claim 34, wherein all of said lenses are made of the same material.

47. The catadioptric reduction objective of claim 46, wherein all of said lenses are made of fluoride crystal.

48. The catadioptric reduction objective of claim 47, wherein said fluoride crystal is selected from the group consisting of $CaF_2$, $BaF_2$, $SrF_2$, LiF, NaF and KF.

49. A microscope for imaging an object into an image plane and wherein a light beam is transmitted along a light path, said microscope defining an optical axis and comprising in sequence of travel of said light beam:

a dioptric objective arranged centered on said optical axis and defining an intermediate image plane;

a catadioptric objective centered on said axis;

said dioptric objective being disposed downstream of said object to image said object into said intermediate image plane;

said catadioptric objective imaging the image of said object in said intermediate image plane into said image plane; and, said catadioptric objective including also in sequence of travel of said light beam:

a first lens group having a negative refractive power and arranged centered on said optical axis;

a first concave mirror having a central cutout and being arranged centered on said optical axis downstream of said first lens group;

a second concave mirror having a central cutout and being arranged centered on said optical axis downstream of said first concave mirror;

said first and second concave mirrors being disposed so as to face each other;

a second lens group having a negative refractive power and being arranged centered on said optical axis downstream of said second concave mirror;

said first lens group having a first plurality of lenses arranged upstream of said first concave mirror;

said second lens group having a second plurality of lenses arranged downstream of said second concave mirror; and, one of said first and second plurality of lenses having at least one aspheric lens surface.

50. A microlithographic projection exposure apparatus for exposing an object including a photosensitive layer on a substrate and wherein a light beam is transmitted along a light path, comprising in sequence of travel of said light beam:

a light source;

an illuminating system downstream of said light source;

a mask holder for holding a structure mask in said light path downstream of said illuminating system;

a catadioptric objective mounted downstream of said first dioptric component objective;

a holder downstream of said catadioptric objective for holding said object in said light path;

wherein said catadioptric objective defines an optical axis, said catadioptric objective comprising in sequence of travel of said light beam:

a first lens group having a negative refractive power and arranged centered on said optical axis;

a first concave mirror having a central cutout and being arranged centered on said optical axis downstream of said first lens group;

a second concave mirror having a central cutout and being arranged centered on said optical axis downstream of said first concave mirror;

said first and second concave mirrors being disposed so as to face each other;

a second lens group having a negative refractive power and being arranged centered on said optical axis downstream of said second concave mirror;

said first lens group having a first plurality of lenses arranged upstream of said first concave mirror;

said second lens group having a second plurality of lenses arranged downstream of said second concave mirror; and, one of said first and second plurality of lenses having at least one aspheric lens surface,

*wherein said catadioptric objective has an object end region and an image end region and said catadioptric objective comprising a field lens group disposed in one of said object end region and said image end region, said field lens group having said aspheric lens surface.*

51. The microlithographic projection exposure apparatus of claim 50, said catadioptric objective being a catadioptric reduction objective comprising:

a first partial objective defining an intermediate image plane;

a second partial objective mounted downstream or upstream of said first partial objective;

said first and second partial objectives conjointly defining a common optical axis and being centered thereon;

said first partial objective being a catadioptric objective and said second partial objective being a purely refractive objective; and, said catadioptric objective including in sequence of travel of said light beam:

a first lens group having a negative refractive power and arranged on said optical axis;

a first concave mirror having a central cutout and being arranged on said optical axis downstream of said first lens group;

a second concave mirror having a central cutout and being arranged on said optical axis downstream of said first concave mirror;

said first and second concave mirrors being disposed so as to face each other;

a second lens group having a negative refractive power and being arranged on said optical axis downstream of said second concave mirror;

said first lens group having a first plurality of lenses arranged upstream of said first concave mirror;

said second lens group having a second plurality of lenses arranged downstream of said second concave mirror; and, one of said first and second plurality of lenses having at least one aspheric lens surface.

*52. A catadioptric objective wherein a light beam is transmitted along a light path and said catadioptric objective defining an optical axis, said catadioptric objective comprising in sequence of travel of said light beam:*

*a first lens group arranged centered on said optical axis;*

*a first concave mirror being arranged downstream of said first lens group;*

*a second concave mirror being arranged downstream of said first concave mirror;*

*said first and second concave mirrors being disposed so as to face each other;*

*a second lens group being arranged centered on said optical axis downstream of said second concave mirror;*

*said first lens group having a first plurality of lenses;*

*said second lens group having a second plurality of lenses; and,*

*one of said first and second plurality of lenses having at least one aspheric lens surface,*

*wherein said catadioptric objective has an object end region and an image end region and said catadioptric objective comprising a field lens group disposed in one of said object end region and said image end region, said field lens group having said aspheric lens surface.*

*53. The catadioptric objective of claim 52, wherein said catadioptric objective has an object end region and an image end region; and,*

*said catadioptric objective further comprising a field lens group disposed in one of said object end region and said image end region; and,*

*said field lens group having said aspheric lens surface.*

*54. The catadioptric objective of claim 52, wherein light rays pass through said first and second lens groups in only one direction.*

*55. The catadioptric objective of claim 52, wherein a first pupil plane is disposed in said light path between said first concave mirror and said second concave mirror.*

*56. The catadioptric objective of claim 52, wherein said catadioptric objective has an object end region; and,*

*the maximum deviation of the real pupil function of said object end region from a line fit through said real pupil function is less than ±10 mrad.*

*57. The catadioptric objective of claim 56, wherein said maximum deviation is less than ±5 mrad.*

*58. The catadioptric objective of claim 52, wherein all of said lenses are made of the same material.*

*59. The catadioptric objective of claim 52, wherein said first and second concave mirrors conjointly define a space therebetween containing a gas having a pressure and temperature dependency on its refractive index less than nitrogen.*

*60. The catadioptric objective of claim 59, wherein said gas is helium.*

*61. A catadioptric objective wherein a light beam is transmitted along a light path and said catadioptric objective comprising:*

*a first partial objective defining an intermediate image plane;*

*a second partial objective mounted downstream or upstream of said first partial objective;*

*said first and second partial objectives conjointly defining a common optical axis and being centered thereon;*

*said first partial objective being a catadioptric objective according to claim 52 and said second partial objective being a purely refractive objective.*

*62. The catadioptric objective of claim 61, wherein the absolute value of the magnification ratio of said catadioptric reduction objective lies in the range from 0.1 to 0.5.*

*63. The catadioptric objective of claim 62, wherein the absolute value of the magnification ratio of said first partial objective lies in a range from 0.7 to 1.3.*

*64. The catadioptric objective of claim 61, wherein said refractive objective having at least one lens having an aspheric surface.*

*65. The catadioptric objective of claim 63, wherein a first pupil plane is disposed in said light path between said first concave mirror and said second mirror; said refractive objective containing a second pupil plane;*

*said refractive objective includes a third plurality of lenses defining a first aspheric surface upstream of said second pupil plane and a second aspheric surface downstream of said second pupil plane; and,*

*wherein $h_{a1}$ is the height of a chief ray at said first aspheric surface and $h_{a2}$ is the height of a chief ray at said second aspheric surface; and, the following relationship applies:*

$$0.7 < \left|\frac{h_{a1}}{h_{a2}}\right| < 1.3.$$

66. The catadioptric reduction objective of claim 65, wherein said relationship is:

$$0.8 < \left|\frac{h_{a1}}{h_{a2}}\right| < 1.2.$$

67. The catadioptric objective of claim 61, said catadioptric reduction objective having two mutually adjacent aspheric lens surfaces.

68. The catadioptric objective of claim 67, said two mutually adjacent aspheric lens surfaces conjointly defining a space therebetween filled with a medium having a refractive index<1.1.

69. The catadioptric objective of claim 67, wherein said refractive objective includes an aperture stop (AS2');

$h_{a3}$ is the maximum ray height of chief rays at said mutually adjacent lens surfaces; and, $h_{AS}$ is the height of said aperture stop (AS2'); and, wherein the following relationship applies:

$$\frac{h_{a3}}{h_{AS}} < 0.15.$$

70. The catadioptric objective of claim 69, wherein:

$$\frac{h_{a3}}{h_{AS}} < 0.10.$$

71. The catadioptric objective of claim 61, wherein said refractive objective includes an object end region and an image end region; and, said refractive objective includes a field lens group in said object end region and said field lens group including an aspheric lens surface.

72. The catadioptric objective of claim 61, wherein all of said lenses are made of the same material.

73. A catadioptric objective wherein a light beam is transmitted along a light path from an object plane to an image plane and said catadioptric objective defining an optical axis, said catadioptric objective comprising:

a first concave mirror being arranged concavely to the object plane;

a second concave mirror being arranged concavely to the image plane;

and a plurality of lenses, having two mutually adjacent aspheric surfaces, wherein said two mutually adjacent aspheric lens surfaces conjointly define a space therebetween filled with a medium having a refractive index <1.1.

74. A catadioptric objective wherein a light beam is transmitted along a light path from an object plane to an image plane and said catadioptric objective defining an optical axis, said catadioptric objective comprising in sequence of travel of said light beam:

a first lens group being arranged centered on said optical axis;

a first concave mirror being arranged downstream of said first lens group and being arranged concavely to the object plane;

a second concave mirror being arranged downstream of said first concave mirror and being arranged concavely to the image plane;

a second lens group being arranged centered on said optical axis downstream of said second concave mirror;

said first lens group having a first plurality of lenses;

said second lens group having a second plurality of lenses; and, one of said first and second plurality of lenses having at least one aspheric lens surface, wherein said catadioptric objective has an object end region and an image end region and said catadioptric objective comprising a field lens group disposed in one of said object end region and said image end region, said field lens group having said aspheric lens surface.

75. The catadioptric objective of claim 74, wherein light rays pass through said first and second lens groups in only one direction.

76. The catadioptric objective of claim 74, wherein the light path between said first concave mirror and said second concave mirror is free of lenses.

77. The catadioptric objective of claim 74, wherein a first pupil plane is disposed in said light path between said first concave mirror and said second concave mirror.

78. The catadioptric objective of claim 74, wherein said optical axis is a straight optical axis.

79. The catadioptric objective of claim 74, wherein said first concave mirror and said second concave mirror are arranged outside of said optical axis.

80. The catadioptric objective of claim 74, wherein said first concave mirror and said second concave mirror have a cutout.

81. The catadioptric objective of claim 74, wherein all of said lenses are made of the same material.

82. A catadioptric objective wherein a light beam is transmitted along a light path from an object plane to an image plane and said catadioptric objective defining an optical axis, said catadioptric objective comprising in sequence of travel of said light beam:

a first lens group being arranged centered on said optical axis;

a first concave mirror being arranged centered on said optical axis downstream of said first lens group and being arranged concavely to the object plane;

a second concave mirror being arranged centered on said optical axis downstream of said first concave mirror and being arranged concavely to the image plane;

a second lens group being arranged centered on said optical axis downstream of said second concave mirror;

wherein said optical axis is a straight optical axis;

wherein the catadioptric objective is arranged to define an intermediate image plane downstream from said second concave mirror.

83. The catadioptric objective of claim 82, wherein light rays pass through said first and second lens groups in only one direction.

84. The catadioptric objective of claim 82, wherein the light path between said first concave mirror and said second concave mirror is free of lenses.

85. The catadioptric objective of claim 82, wherein a first pupil plane is disposed in said light path between said first concave mirror and said second concave mirror.

86. The catadioptric objective of claim 82, wherein said first concave mirror and said second concave mirror are arranged outside of said optical axis.

87. The catadioptric objective of claim 82, wherein said first concave mirror and said second concave mirror have a cutout.

88. The catadioptric objective of claim 82, wherein all of said lenses are made of the same material.

* * * * *

UNITED STATES PATENT AND TRADEMARK OFFICE

CERTIFICATE OF CORRECTION

PATENT NO. : RE42,570 E
APPLICATION NO. : 11/247002
DATED : July 26, 2011
INVENTOR(S) : Schuster It is certified that error appears in the above-identified patent and that said Letters Patent is hereby corrected as shown below:

Column 6, line 10, after "imaged" delete "to"

Column 7, line 51, delete "λ32" insert -- λ= --

Column 10, line 52, delete "12." insert -- L2 --

Column 12, line 26, delete "throughgoing" insert -- thoroughgoing --

Column 16, line 17, delete "111" insert -- I11 --

Column 16, line 54, Table 1, delete "THICKESSES" insert -- THICKNESS --

Column 17, line 1, Table 1-continued, delete "THICKESSES" insert -- THICKNESS --

Column 18, line 37, Table 2, delete "IM1" insert -- IMI --

Column 18, line 40, Table 2, delete "23.337" insert -- 23.537 --

Column 18, line 48, Table 2, delete "-235.338" insert -- -235.538 --

Column 18, line 50, Table 2, delete "22.353" insert -- 22.553 --

Column 18, line 59, Table 2, delete "142" insert -- N2 --

Column 19, line 57, delete "-.3345014000E-37" insert -- .3345014000E-37 --

Column 20, line 44, delete "-.1187390103E-25" insert -- -.1187390100E-25 --

Column 20, line 59, Table 3, delete "Minor" insert -- Mirror --

Column 21, line 41, Table 3-continued, delete "11340" insert -- 11.340 --

Column 22, line 34, delete "-0.1693100300E-21" insert -- 0.1693100300E-21 --

Column 22, line 66, delete "0.3665147100-18" insert -- 0.3665147100E-18 --

Column 24, line 23, Claim 2, after "1," delete "p1"

Signed and Sealed this
Eleventh Day of October, 2011

David J. Kappos

David J. Kappos
*Director of the United States Patent and Trademark Office*